(12) United States Patent
Kimura et al.

(10) Patent No.: US 8,218,408 B2
(45) Date of Patent: Jul. 10, 2012

(54) INFORMATION RECORDING METHOD AND INFORMATION REPRODUCING METHOD

(75) Inventors: Naohiro Kimura, Kyoto (JP); Kohei Nakata, Nara (JP); Toyoji Gushima, Osaka (JP); Hiroshi Ueda, Nara (JP)

(73) Assignee: Panasonic Corporation, Osaka (JP)

( * ) Notice: Subject to any disclaimer, the term of this patent is extended or adjusted under 35 U.S.C. 154(b) by 646 days.

(21) Appl. No.: 12/329,755

(22) Filed: Dec. 8, 2008

(65) Prior Publication Data

US 2009/0180365 A1 Jul. 16, 2009

(30) Foreign Application Priority Data

Dec. 7, 2007 (JP) ................................. 2007-316904
Dec. 1, 2008 (JP) ................................. 2008-306135

(51) Int. Cl.
*G11B 5/09* (2006.01)
*G11B 7/00* (2006.01)

(52) U.S. Cl. ................ 369/47.17; 369/59.23; 369/53.33

(58) Field of Classification Search ........................ None
See application file for complete search history.

(56) References Cited

U.S. PATENT DOCUMENTS

| 5,408,531 | A | 4/1995 | Nakajima | |
|---|---|---|---|---|
| 6,842,522 | B1 | 1/2005 | Downing | |
| 7,058,977 | B1 | 6/2006 | Furukawa et al. | |
| 7,236,435 | B2 | 6/2007 | Kobayashi | |
| 2004/0139381 | A1* | 7/2004 | Inokuchi et al. | 714/758 |
| 2006/0087947 | A1* | 4/2006 | Minemura et al. | 369/59.22 |

FOREIGN PATENT DOCUMENTS

| CN | 1860537 A | 11/2006 |
|---|---|---|
| JP | 05-081774 | 4/1993 |
| JP | 08-125548 | 5/1996 |
| JP | 2001-057022 | 2/2001 |
| JP | 2002-279645 | 9/2002 |
| JP | 2003-228910 | 8/2003 |

(Continued)

OTHER PUBLICATIONS

Notice of Reasons for Rejection for corresponding Japanese Application No. 2009-524631 issued on Sep. 7, 2010 and English translation.

(Continued)

*Primary Examiner* — Mohammad Ghayour
*Assistant Examiner* — Carl Adams
(74) *Attorney, Agent, or Firm* — Renner, Otto, Boisselle & Sklar, LLP

(57) ABSTRACT

According to the present invention, when an apparatus performs reproduction from an optical disc of a format not compatible to the apparatus, the apparatus is prevented from obtaining an incorrect address and thus causing a malfunction. A recording method according to the present invention performs first conversion of bit-inverting m number ($1 \leq m < n$; m an integer) of symbols at prescribed positions of a code word coded using an error correction code by a Reed-Solomon code and including symbol $C(i)$ [$i=0, 1, 2, \ldots n$; n is an integer] to generate conversion information; and records the conversion information on a first recording medium. The first conversion is set such that a distance between first information obtained by performing inverse conversion to the first conversion on the conversion information, and second information obtained by performing inverse conversion to second conversion, which is different from the first conversion, on the conversion information, is at least ½ of a minimum free distance of the error correction code.

3 Claims, 25 Drawing Sheets

FOREIGN PATENT DOCUMENTS

| | | |
|---|---|---|
| JP | 2003-535424 | 11/2003 |
| WO | 03/063157 A1 | 7/2003 |

OTHER PUBLICATIONS

International Search Report for corresponding Application No. PCT/JP2008/003643 dated Jan. 20, 2009.

Form PCT/ISA/237 and a partial English translation.

Blu-ray Disc Reader, published by Ohmsha, Ltd., pp. 13-28 with a concise explanation (cited in line 9, p. 102 of the specification, the website of Blu-ray Association (http://www.blu-raydisc.com)).

White paper, Blu-ray Disc Format, General, Aug. 2004, pp. 1-37. (cited in line 10, p. 102 of the specification, the website of Blu-ray Association (http://www.blu-raydisc.com)).

White paper, Blu-ray Disc Format, 3. File System Specifications for BD-RE, R, ROM, Aug. 2004, pp. 1-6. (cited in line 10, p. 102 of the specification, the website of Blu-ray Association (http://blu-raydisc.com)).

White paper, Blu-ray Disc Format, 4. Key Technologies, Aug. 2004, pp. 1-8. (cited in line 10, p. 102 of the specification, the website of Blu-ray Association (http://www.blu-raydisc.com)).

Extended European Search Report including Supplementary Partial European Search Report for corresponding European Application No. EP 08 85 7914 issued on Jan. 19, 2012.

Kobayashi et al., "Wobble-Address Format of the Blu-ray Disc", Japanese Journal of Applied Physics, Japan, Society of Applied Physics, Japan, vol. 42, No. 2B, Feb. 1, 2003, pp. 915-918, XP001155099.

Bluem et al., "Informed Decoding in an Address Format", Japanese Journal of Applied Physics, Japan, Society of Applied Physics, Japan, vol. 41, No. 3B, Part 01, Mar. 1, 2002, pp. 1785-1786, XP001088828.

Chinese Office Action for corresponding Chinese Application No. 200880004420.X issued on Jun. 24, 2011 and partial English translation.

* cited by examiner

INFORMATION RECORDING METHOD AND INFORMATION REPRODUCING METHOD

BACKGROUND OF THE INVENTION

1. Field of the Invention

The present invention relates to a recording method and a reproducing method of error-correction-coded information.

2. Description of the Related Art

An example of data to be recorded on optical discs such as CDs and DVDs is data which is error-correction-coded using an error correction code such as a Reed-Solomon code or the like (see, for example, Japanese Laid-Open Patent Publication No. 8-125548). For write once and rewritable discs, address information recorded by a wobble form of a track is also error-correction-coded. For example, for wobble addresses (ADIP: ADress In Pregroove) for DVD+RW discs, a shortened Reed-Solomon code RS (13,8,6) is used.

For recording information on a write once or rewritable disc, information needs to be recorded at a correct position. If information is recorded at an incorrect position, information may not be correctly reproduced or information already recorded may be erased, for example. In order to avoid this, address information recorded by wobbling of the track needs to be correctly detected. One method for realizing this is to improve the correction capability of an error correction code (to increase the number of parities added to the address information).

A Reed-Solomon code used for a DVD+RW disc is a code on Galois Field GF ($2^4$) and so has a maximum code length of 15. Therefore, without being shortened, the number of parities can be increased by 2 symbols, and a Reed-Solomon code RS (15,8,8) can have a correction capability improved by 1 symbol.

With reference to FIG. 1A, error-correction-coded address information will be described. Address information 10 represented by eight symbols ($A_0, A_1, A_2, A_3, A_4, A_5, A_6, A_7$) is error-correction-coded by a Reed-Solomon code RS (15,8,8) to generate coded information 11 including added seven parity symbols ($A_8$ through $A_{14}$). Here, the symbols of the coded information 11 will be represented by $E_0$ through $E_{14}$. The coded information 11 is recorded on an optical disc (information recording medium) using a known system, for example, ADIP used for a DVD+RW disc.

For reproducing the address information, as shown in FIG. 1B, the information is reproduced from the optical disc to obtain reproduction coded information 12. The reproduction coded information 12 is obtained by reproducing the coded information 11 recorded on the optical disc. This reproduction coded information 12 is error-corrected to reproduce the address information 10. By the error correction in this example, errors within three symbols are corrected.

When AUX (AUXiliary) in ADIP is used as a parity to generate a Reed-Solomon code RS (13,6,8), the correction capability of the error correction code can be improved without changing the code length thereof. In this case, the address information can be detected more correctly by only changing the format of an error correction coding section.

However, when a new format disc in which the correction capability of the error correction code is improved using the Reed-Solomon code RS (13,6,8) is reproduced by a conventional recording/reproducing apparatus (an apparatus not compatible to the new format but compatible to the DVD+RW (old format)), there is a high possibility that an incorrect address is reproduced because the format of the error correction section is different, although a code word can be reproduced from a wobble reproduction signal because the modulation method is common.

For example, for moving an optical spot to a position close to an address A, the optical spot is usually allowed to reach such a position close to the address A in the following procedure: "the current address is obtained and converted into a radius" to "the optical spot is moved by the difference between the obtained radius and the radius of the address A" to "the post-movement address is obtained and converted into a radius" to "the optical spot is confirmed to be in the vicinity of the address A and the procedure is finished". When the optical spot cannot move to a position close to the address A by one movement, substantially the same operation is repeated until the above procedure is finished.

For moving the optical spot from an address B at around a radius of 50 mm to an address A at around a radius of 40 mm, the optical spot is usually allowed to reach a position close to the address A by the following procedure: "the current address B is obtained and the optical spot is found to be at a position of the radius of 50 mm" to "the optical spot is moved inward by 10 mm, which is the difference from the address A" to "the post-movement address is obtained and the optical spot is confirmed to be in the vicinity of the address A".

However, if the pre-movement address B is incorrectly obtained as being around a radius of 25 mm, the optical spot is moved outward by 15 mm. Since the disc has a radius of only 60 mm, the optical spot goes outside the disc. In order to return the optical spot, it is necessary to move the optical spot to a certain area of the disc, perform focusing control or tracking control, then obtain the current address of the optical spot again and move the optical spot. Even if the optical spot is successfully moved to a position around a radius of 40 mm, if the address obtained as a post-movement address is incorrect, the optical spot may be repeatedly moved by the difference from the address A many times.

SUMMARY OF THE INVENTION

The present invention made in light of the above-described problems has an object of providing a method for preventing an apparatus from obtaining an incorrect address and causing a malfunction when reproducing an optical disc not compatible to the apparatus.

A recording method according to the present invention comprises the steps of performing first conversion of bit-inverting at least one symbol of a code word coded using an error correction code and including a plurality of symbols to generate conversion information; and recording the conversion information on a first recording medium. The first conversion is set such that a distance between first information obtained by performing inverse conversion to the first conversion on the conversion information, and second information obtained by performing inverse conversion to second conversion, which is different from the first conversion, on the conversion information, is at least ½ of a minimum free distance of the error correction code.

According to an embodiment, the first conversion bit-inverts m number (m is an integer) of consecutive symbols.

According to an embodiment, the first conversion allows at least one non-bit-inverted symbol to be present among a prescribed m number (m is an integer) of bit-inverted symbols.

According to an embodiment, the second conversion bit-inverts symbols C(9) through C(14) of a code word including symbol C(i) [i=0, 1, 2, . . . 14].

According to an embodiment, the first conversion generates conversion information to be recorded on the first recording medium; and the second conversion generates conversion information to be recorded on a second recording medium having a different recording capacity from that of the first recording medium.

According to an embodiment, the first conversion does not bit-invert the symbol C(14).

According to an embodiment, the information coded using the error correction code includes at least address information; and the first conversion bit-inverts a symbol including the least significant bit of the address information.

A recording method according to the present invention comprises the steps of performing first conversion of bit-inverting m number ($1 \leq m < n$; m is an integer) of symbols at prescribed positions of a code word coded using an error correction code and including symbol (i) [$i=0, 1, 2, \ldots n$; n is an integer] to generate conversion information; and recording the conversion information on a first recording medium. The first conversion is set such that a distance between first information obtained by performing inverse conversion to the first conversion on the conversion information, and second information obtained by performing inverse conversion to second conversion, which bit-inverts j number ($1 \leq j < n$; j is an integer) of consecutive symbols from the end of symbol C(i) unlike the first conversion, on the conversion information, is at least ½ of a minimum free distance of the error correction code.

An information recording medium according to the present invention has conversion information recorded thereon, obtained by bit-inverting m number ($1 \leq m < n$; m is an integer) of symbols of a code word including symbol C(i) [$i=0, 1, 2, \ldots n$; n is an integer).

According to an embodiment, a plurality of the symbols are bit-inverted; and the plurality of bit-inverted symbols allow at least one non-bit-inverted symbol to be present among a prescribed m number of bit-inverted symbols, and are divided into k number (k is an integer of 2 or greater) of symbol groups which are not adjacent to each other.

According to an embodiment, among the k number of symbol groups, between a first symbol group and a second symbol group, there are p number (p is an integer of 2 or greater) of symbols.

According to an embodiment, one of the k number of symbol groups includes symbol C(2).

According to an embodiment, one of the k number of symbol groups includes symbol C(3).

According to an embodiment, one of the k number of symbol groups includes symbol C(12).

According to an embodiment, the number of the symbol groups is 3 or greater; and one of the symbol groups includes symbols C(2) and C(3).

An information recording medium according to the present invention includes information in which symbol C(2) and symbol C(12) are bit-inverted, and symbol C(5) and symbol C(14) are not bit-inverted.

A reproducing method according to the present invention is for reproducing information from the first information recording medium having address information recorded thereon by the above-described recording method, by which the recorded address information is reproduced by collecting laser light on the first information medium, and reproduction is performed from the information recording medium based on the address information.

According to an embodiment, where the number of errors of coded information obtained by performing one of inverse conversion to the first conversion and inverse conversion to the second conversion on the conversion information reproduced from the first recording medium is at least ½ of a minimum free distance of the error correction code, the other of the inverse conversion to the first conversion and the inverse conversion to the second conversion is performed on the conversion information.

According to the present invention, even when an apparatus performs reproduction from an optical disc of a format not compatible to the apparatus, the apparatus can be prevented from obtaining an incorrect address and thus causing a malfunction.

BRIEF DESCRIPTION OF THE DRAWINGS

FIG. 10A shows processing of generating conversion information from error-correction-coded address information according to an embodiment of the present invention.

FIG. 10B shows a reproduction operation of an apparatus which is compatible to bit inversion processing of the second conversion mode but is not compatible to bit inversion processing of the first conversion mode according to an embodiment of the present invention.

DETAILED DESCRIPTION OF PREFERRED EMBODIMENTS

Hereinafter, embodiments of the present invention will be described with reference to the drawings.

(Embodiment 1)

In embodiments of the present invention, bit inversion is performed on m number ($1 \leq m < n$; m is an integer) of symbols of a code word including symbol: C(i) [i=0, 1, 2, ... n; n is an integer] to generate conversion information. The generated conversion information is recorded on an information recording medium. C(x) represents an x'th symbol. For example, C(0) represents the zeroth symbol, and C(10) represents the tenth symbol.

For example, conversion processing of inverting all the bits of a plurality of symbols of error-correction-coded address information is performed, and conversion information generated by the conversion processing is recorded on an information recording medium. The information recording medium is, for example, an optical disc.

Figure 1A:
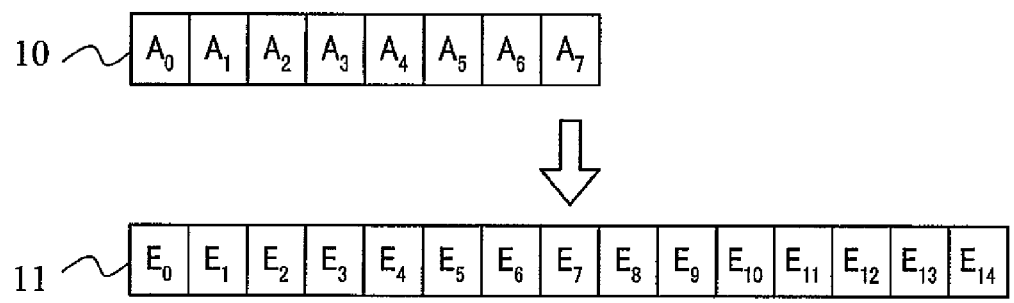
FIG. 1A shows error-correction-coded address information.
Figure 1B:
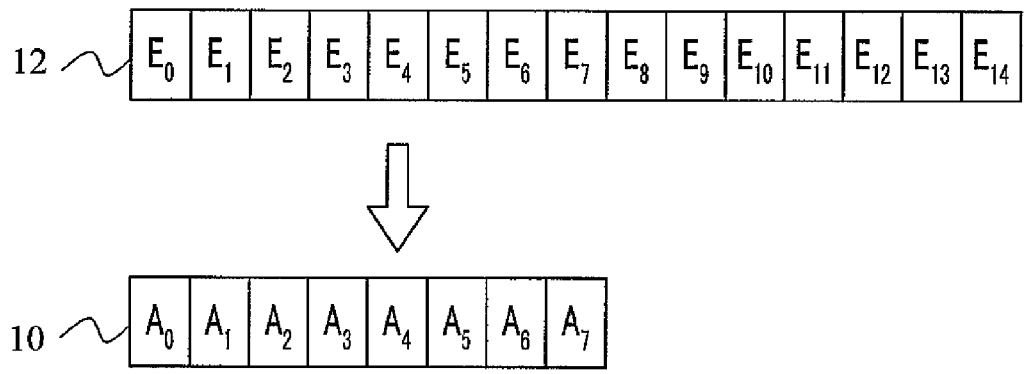
FIG. 1B shows processing of reproducing address information.
Figure 2A:
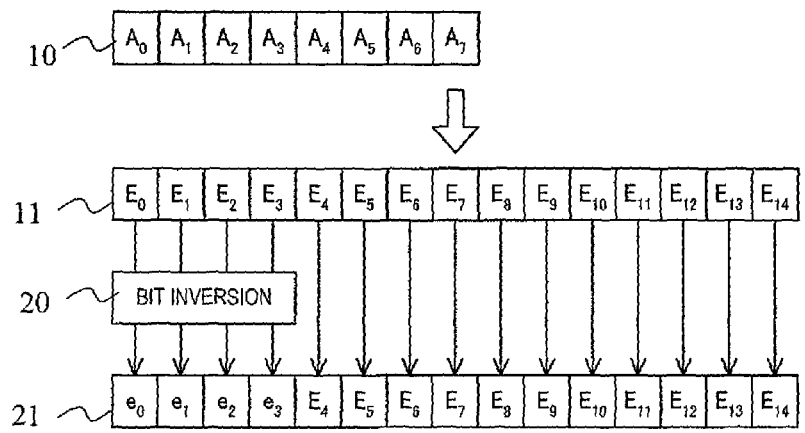
FIG. 2A shows processing of generating conversion information from error-correction-coded address information according to an embodiment of the present invention.

FIG. 2A shows processing of generating conversion information from error-correction-coded address information. Address information 10 represented by eight symbols ($A_0$, $A_1$, $A_2$, $A_3$, $A_4$, $A_5$, $A_6$, $A_7$) is error-correction-coded by a Reed-Solomon code RS (15,8,8) to generate coded information 11 including added seven parity symbols ($A_8$ through $A_{14}$). Here, the symbols of the coded information 11 will be represented by $E_0$ through $E_{14}$. Symbols $E_0$ through $E_7$ correspond to symbols $A_0$ through $A_7$, and symbols $E_8$ through $E_{14}$ correspond to symbols $A_8$ through $A_{14}$.

Next, conversion of inverting all the bits of each of four symbols ($E_0$, $E_1$, $E_2$, $E_3$) of the coded information 11 (bit inversion processing 20) is performed to generate conversion information 21. Here, symbol $e_x$ is a symbol obtained by inverting all the bits of symbol $E_x$. The four symbols ($E_0$, $E_1$, $E_2$, $E_3$) are converted into symbols ($e_0$, $e_1$, $e_2$, $e_3$).

The generated conversion information 21 is recorded on an optical disc. The conversion information 21 can be recorded by a known recording system, for example, ADIP used for DVD+RW discs. On the optical disc, pieces of conversion information 21 generated from different pieces of address information 10 are recorded sequentially.

Figure 2B:
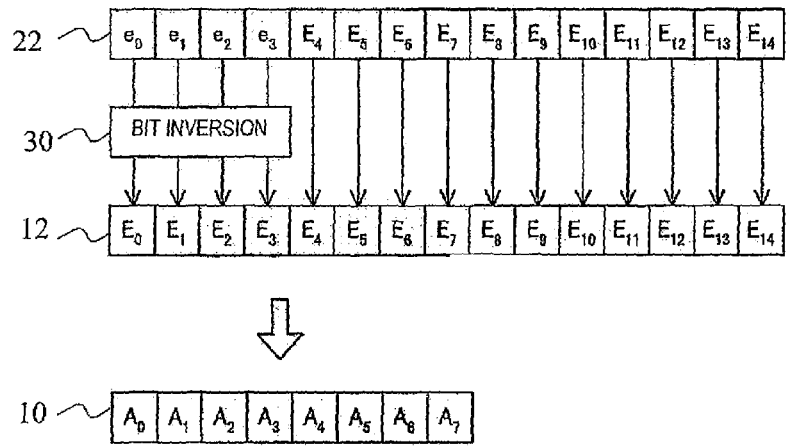
FIG. 2B shows processing of generating address information from reproduction information according to an embodiment of the present invention.

Next, a method for reproducing address information will be described. FIG. 2B shows processing of generating address information from the reproduction information.

For reproducing address information, as shown in FIG. 2B, information is reproduced from an optical disc to obtain reproduction conversion information 22. The reproduction conversion information 22 is obtained by reproducing the conversion information 21 recorded on the optical disc.

Bit inversion processing 30 which is inverse to the bit inversion processing 20 is performed on the reproduction conversion information 22 reproduced from the optical disc to generate reproduction coded information 12. The bit inversion processing 30 inverts all the bits of each of four symbols ($e_0$, $e_1$, $e_2$, $e_3$) of the reproduction conversion information 22 to obtain four symbols ($E_0$, $E_1$, $E_2$, $E_3$). Some of the 15 symbols of the obtained reproduction coded information 12 may be reproduced with an incorrect value, but errors within three symbols are corrected by error correction processing. Thus, address information 10 is reproduced.

Figure 2C:
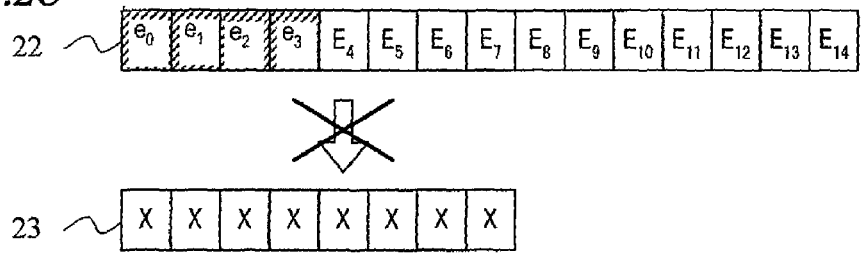
FIG. 2C shows an operation by which an apparatus which does not have a function of bit inversion processing reproduces reproduction conversion information according to an embodiment of the present invention.

Next, an operation of reproducing the reproduction conversion information 22 from an optical disc by an apparatus which does not have a function of performing bit inversion processing 30 will be described. FIG. 2C shows an operation by which an apparatus which does not have a function of performing bit inversion processing 30 reproduces the reproduction conversion information 22. As shown in FIG. 2C, the information is reproduced from the optical disc to obtain the reproduction conversion information 22. Four symbols ($e_0$, $e_1$, $e_2$, $e_3$) from the zeroth to third symbols of the reproduction conversion information 22 show information obtained by inverting all the bits of the symbols ($E_0$, $E_1$, $E_2$, $E_3$). Due to this, the reproduction conversion information 22 includes four symbol errors. The number of symbols which can be corrected by the Reed-Solomon code RS (15,8,8) is three or smaller. Therefore, the apparatus detects that the error correction of the reproduction conversion information 22 is impossible and can determine that an error 23 has occurred on the stage of error correction without reproducing incorrect address information. Owing to this, even when the apparatus reproduces information from an optical disc not compatible thereto, the apparatus can be prevented from obtaining an incorrect address and thus causing a malfunction.

In this manner, the coded information is converted into conversion information using a conversion method by which a number of symbols exceeding the correction capability of the error correction code are not recovered to the original symbols, and the obtained conversion information is recorded on an optical disc. Thus, an error can be detected by error correction processing without incorrect address information being reproduced.

Next, with reference to FIG. 3A, an example in which different symbols from those of the above example are bit-inverted will be described.

Figure 3A:
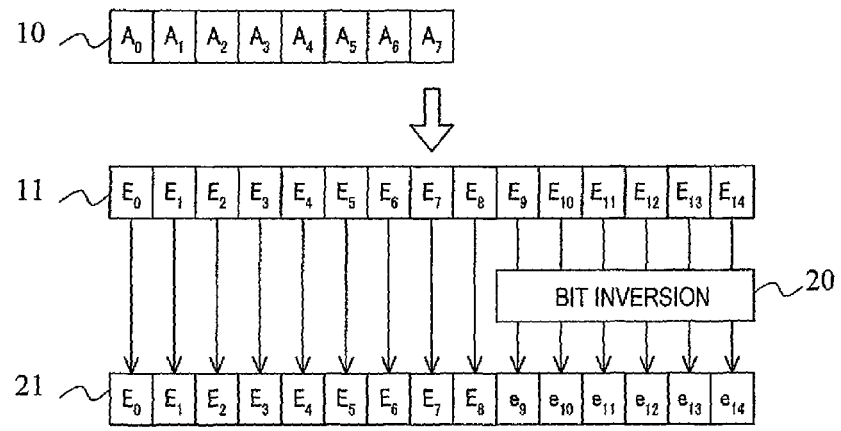
FIG. 3A shows processing of generating conversion information from error-correction-coded address information according to an embodiment of the present invention.

FIG. 3A shows processing of generating conversion information from error-correction-coded address information. Like the processing shown in FIG. 2A, address information 10 represented by eight symbols ($A_0$ through $A_7$) is error-correction-coded to generate coded information 11.

In the example shown in FIG. 3A, conversion of inverting all the bits of each of six symbols ($E_9$, $E_{10}$, $E_{11}$, $E_{12}$, $E_{13}$, $E_{14}$) of the coded information 11 (bit inversion processing 20) is performed to generate conversion information 21. The six symbols ($E_9$, $E_{10}$, $E_{11}$, $E_{12}$, $E_{13}$, $E_{14}$) are converted into symbols ($e_9$, $e_{10}$, $e_{11}$, $e_{12}$, $e_{13}$, $e_{14}$). The generated conversion information 21 is recorded on an optical disc.

Figure 3B:
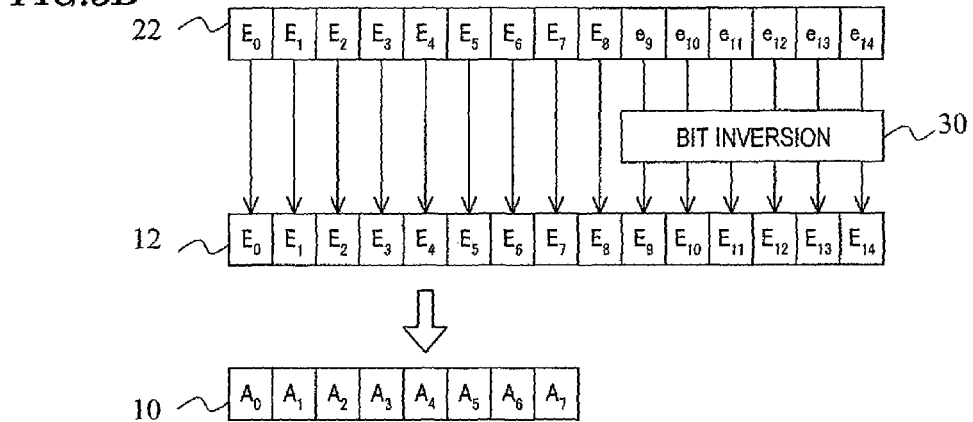
FIG. 3B shows processing of generating address information from reproduction conversion information according to an embodiment of the present invention.

Next, a method for reproducing address information will be described. FIG. 3B shows processing of generating address information from the reproduction information.

For reproducing address information, as shown in FIG. 3B, information is reproduced from an optical disc to obtain reproduction conversion information 22. The reproduction conversion information 22 is obtained by reproducing the conversion information 21 recorded on the optical disc.

The processing of reproducing address information from the optical disc is basically the same as the processing described above with reference to FIG. 2B. In this example, as a result of the information reproduction from the optical disc, the reproduction conversion information 22 including six bit-inverted symbols ($e_9$ through $e_{14}$) is obtained. Therefore, bit inversion processing 30 in this example which is inverse to the bit inversion processing 20 inverts all the bits of each of the six symbols ($e_9$ through $e_{14}$) of the reproduction conversion information 22 to obtain symbols ($E_9$ through $E_{14}$). As a result, reproduction coded information 12 including symbols ($E_9$ through $E_{14}$) is obtained. Some of the symbols of the obtained reproduction coded information 12 may be reproduced with an incorrect value, but errors within three symbols are corrected by error correction processing. Thus, address information 10 is reproduced.

Figure 3C:
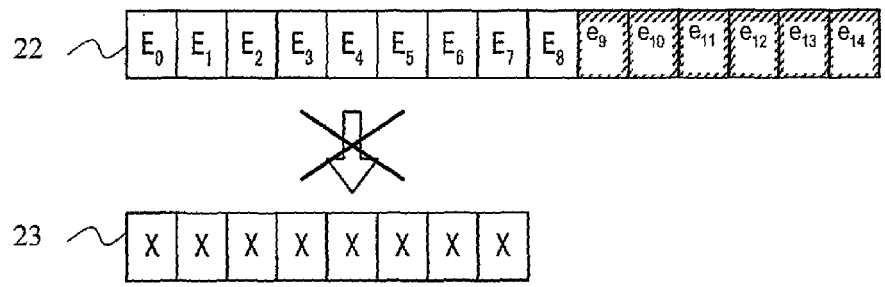
FIG. 3C shows an operation by which an apparatus which does not have a function of bit inversion processing reproduces reproduction conversion information according to an embodiment of the present invention.

Next, an operation of reproducing the reproduction conversion information 22 from an optical disc by an apparatus which does not have a function of performing bit inversion processing 30 will be described. FIG. 3C shows an operation by which an apparatus which does not have a function of performing bit inversion processing 30 reproduces the reproduction conversion information 22. As shown in FIG. 3C, the information is reproduced from the optical disc to obtain the reproduction conversion information 22. Six symbols ($e_9$ through $e_{14}$) of the reproduction conversion information 22 show information obtained by inverting all the bits of the symbols ($E_9$ through $E_{14}$). Due to this, the reproduction conversion information 22 includes six symbol errors. The number of symbols which can be corrected by the Reed-Solomon code RS (15,8,8) is three or smaller. Therefore, the apparatus detects that the error correction of the reproduction conversion information 22 is impossible and can determine that an error 23 has occurred on the stage of error correction without reproducing incorrect address information.

Next, with reference to FIG. 4A, another example in which different symbols from those of the above examples are bit-inverted will be described.

Figure 4A:
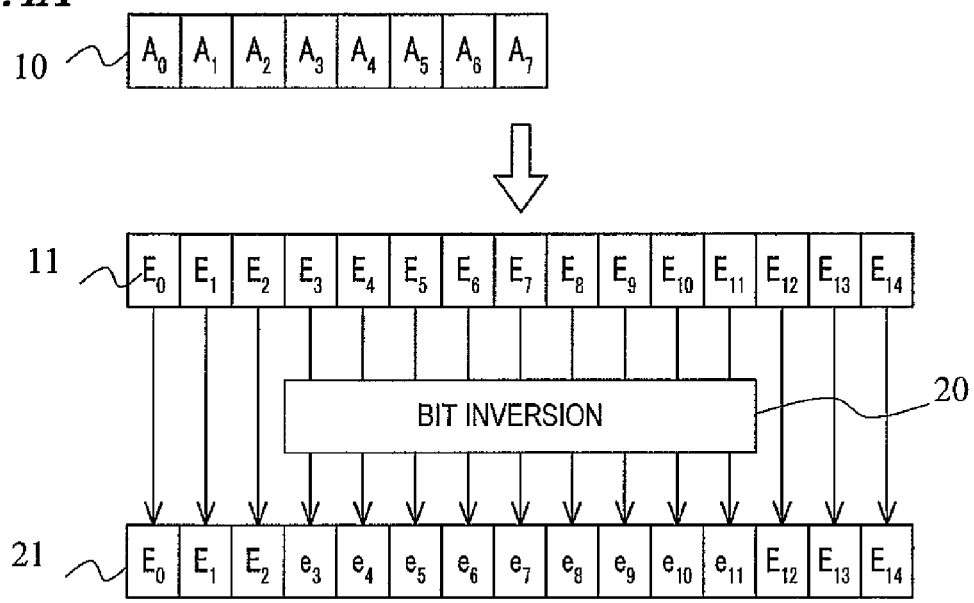
FIG. 4A shows processing of generating conversion information from error-correction-coded address information according to an embodiment of the present invention.

FIG. 4A shows processing of generating conversion information from error-correction-coded address information. Like the processing shown in FIG. 2A, address information 10 represented by eight symbols ($A_0$ through $A_7$) is error-correction-coded to generate coded information 11.

In the example shown in FIG. 4A, conversion of inverting all the bits of each of nine symbols ($E_3$, $E_4$, $E_5$, $E_6$, $E_7$, $E_8$, $E_9$, $E_{10}$, $E_{11}$) of the coded information 11 (bit inversion processing 20) is performed to generate conversion information 21. The nine symbols ($E_3$, $E_4$, $E_5$, $E_6$, $E_7$, $E_8$, $E_9$, $E_{10}$, $E_{11}$) are converted into symbols ($e_3$, $e_4$, $e_5$, $e_6$, $e_7$, $e_8$, $e_9$, $e_{10}$, $e_{11}$). The generated conversion information 21 is recorded on an optical disc.

The processing of reproducing address information from an optical disc is basically the same as the processing described above with reference to FIG. 2B. In this example, as a result of the information reproduction from the optical disc, reproduction conversion information 22 including nine bit-inverted symbols ($e_3$ through $e_{11}$) is obtained. Therefore, bit inversion processing 30 in this example which is inverse to the bit inversion processing 20 inverts all the bits of each of the nine symbols ($e_3$ through $e_{11}$) of the reproduction conversion information 22 to obtain symbols ($E_3$ through $E_{11}$). As a result, reproduction coded information 12 including symbols ($E_3$ through $E_{11}$) is obtained. Some of the 15 symbols of the obtained reproduction coded information 12 may be reproduced with an incorrect value, but errors within three symbols are corrected by error correction processing. Thus, address information 10 is reproduced.

Figure 4B:
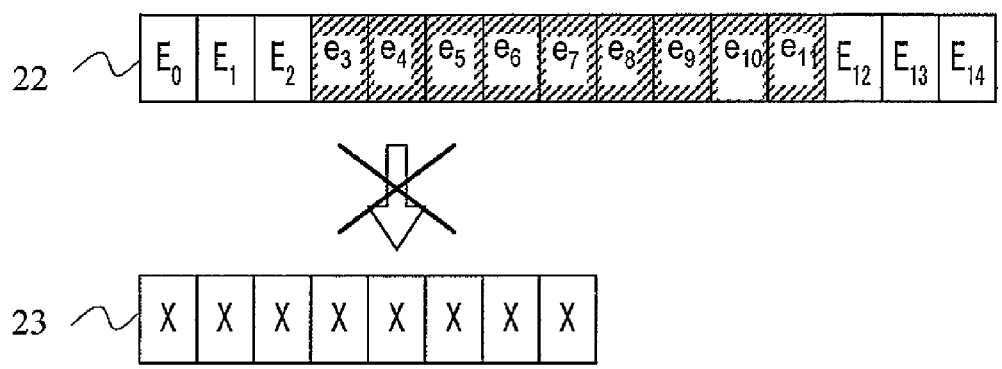
FIG. 4B shows an operation by which an apparatus which does not have a function of bit inversion processing reproduces reproduction conversion information according to an embodiment of the present invention.

Next, an operation of reproducing the reproduction conversion information 22 from an optical disc by an apparatus which does not have a function of performing bit inversion processing 30 will be described. FIG. 4B shows an operation by which an apparatus which does not have a function of performing bit inversion processing 30 reproduces the reproduction conversion information 22. As shown in FIG. 4B, the information is reproduced from the optical disc to obtain the reproduction conversion information 22. Nine symbols ($e_3$ through $e_{11}$) of the reproduction conversion information 22 show information obtained by inverting all the bits of the symbols ($E_3$ through $E_{11}$). Due to this, the reproduction conversion information 22 includes nine symbol errors. The number of symbols which can be corrected by the Reed-Solomon code RS (15,8,8) is three or smaller. Therefore, the apparatus detects that the error correction of the reproduction conversion information 22 is impossible and can determine that an error 23 has occurred on the stage of error correction without reproducing incorrect address information.

As described above, according to Embodiment 1, when the conversion information 21 recorded on an information recording medium after being subjected to the bit-inversion processing 20 is reproduced by an apparatus which does not perform bit-inversion processing 30, a number of symbol errors exceeding the number which can be corrected by a Reed-Solomon code RS (15,8,8) are caused, so that a malfunction is prevented. In order to cause a number of symbol errors exceeding the number which can be corrected by a Reed-Solomon code RS (15,8,8) by reproduction processing which does not perform bit-inversion processing 30, the number of symbols which are bit-inverted by the bit inversion processing 20 should be set to four or greater.

(Embodiment 2)

In Embodiment 1, an operation by which an apparatus which does not have a function of performing the bit inversion processing 30 cannot reproduce address information from the reproduction conversion information 22 and determines that an error has occurred is described. Even an apparatus capable of performing bit inversion processing may be used to reproduce information from an optical disc of a format not compatible to the apparatus. In this embodiment, a method for preventing the apparatus from obtaining an incorrect address and thus causing a malfunction even in such a case will be described.

A code word including symbol C(i) is processed with a first conversion mode of bit-inverting m number of symbols to generate conversion information. The generated conversion information is recorded on an optical disc. The first conversion mode is set such that a distance between first information obtained by performing inverse conversion to the first conversion mode on the conversion information, and second information obtained by performing inverse conversion to a second conversion mode, which is different from the first conversion mode, on the conversion information, is at least ½ of a minimum free distance of the error correction code. Hereinafter, this will be described more specifically.

It is assumed here that on an optical disc, conversion information 21 subjected to bit inversion processing by the first conversion mode is recorded. It is also assumed that an apparatus to be used for reproducing information from this optical disc is compatible to the bit inversion processing of the second conversion mode but is not compatible to the bit inversion processing of the first conversion mode. In this case, when reproducing information from the optical disc by this apparatus, it is necessary to set the apparatus such that the apparatus cannot reproduce address information and determines that an error has occurred.

First, with reference to FIG. 5A, processing of generating conversion information 21 subjected to bit inversion processing by the first conversion mode will be described.

Figure 5A:
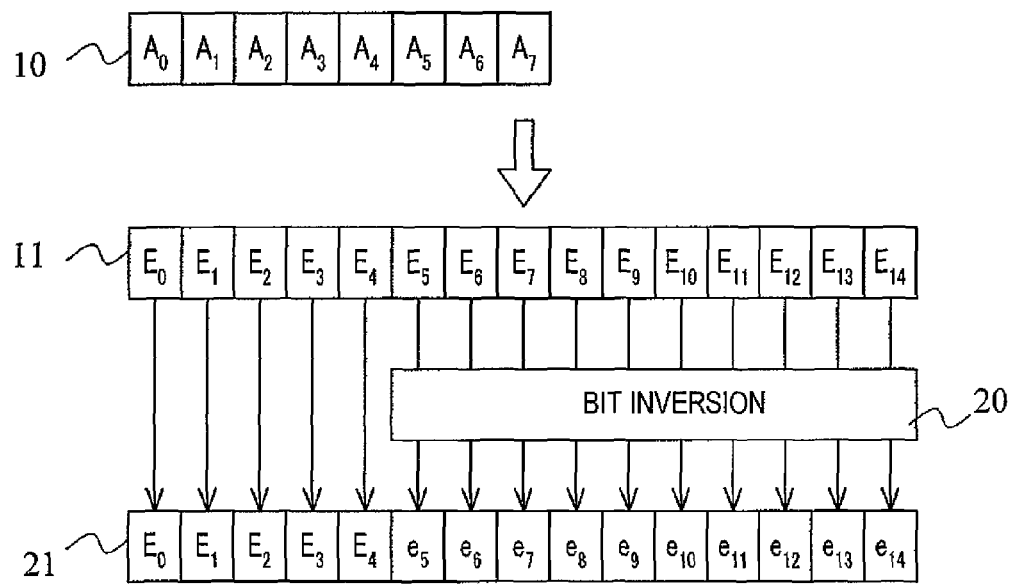
FIG. 5A shows processing of generating conversion information from error-correction-coded address information according to an embodiment of the present invention.

FIG. 5A shows processing of generating conversion information from error-correction-coded address information. Like the processing shown in FIG. 2A, address information 10 represented by eight symbols ($A_0$ through $A_7$) is error-correction-coded to generate coded information 11.

In the example shown in FIG. 5A, conversion of inverting all the bits of each of ten symbols ($E_5$ through $E_{14}$) of the coded information 11 (bit inversion processing 20) is performed to generate conversion information 21. The ten symbols ($E_5$ through $E_{14}$) are converted into symbols ($e_5$ through $e_{14}$). The generated conversion information 21 is recorded on an optical disc.

The processing of reproducing address information from an optical disc is basically the same as the processing described above with reference to FIG. 2B. In this example, as a result of the information reproduction from the optical disc, reproduction conversion information 22 including ten bit-inverted symbols ($e_5$ through $e_{14}$) is obtained. Therefore, bit inversion processing 30 in this example which is inverse to the bit inversion processing 20 inverts all the bits of each of the ten symbols ($e_5$ through $e_{14}$) of the reproduction conversion information 22 to obtain symbols ($E_5$ through $E_{14}$). Some of the 15 symbols of the obtained reproduction coded information 12 may be reproduced with an incorrect value, but errors within three symbols are corrected by error correction processing. Thus, address information 10 is reproduced.

Figure 5B:
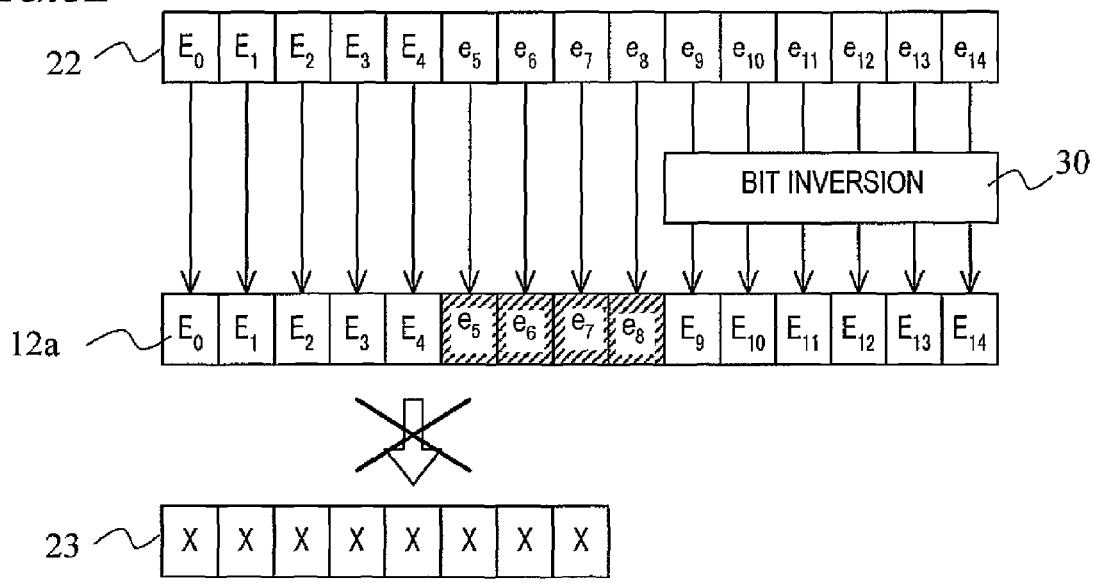
FIG. 5B shows a reproduction operation of an apparatus which is compatible to bit inversion processing of a second conversion mode but is not compatible to bit inversion processing of a first conversion mode according to an embodiment of the present invention.

Next, a reproduction operation of an apparatus which is compatible to the bit inversion processing of the second conversion mode but is not compatible to the bit inversion processing of the first conversion mode will be described. FIG. 5B shows a reproduction operation of such an apparatus.

The second conversion mode inverts j number ($1 \leq j < n$; j is an integer) of consecutive symbols from the end of symbol C(i). For example, the second conversion mode bit-inverts symbols C(9) through C(14) of a code word including symbols C(0) through (14).

Here, it is assumed that the bit inversion processing of the second conversion mode is the bit inversion processing described above with reference to FIGS. 3A and 3B, namely, the processing of performing bit inversion between the symbols ($E_9$ through $E_{14}$) and the symbols ($e_9$ through $e_{14}$).

As shown in FIG. 5B, information is reproduced from an optical disc to obtain reproduction conversion information 22. The reproduction conversion information 22 is obtained by reproducing the conversion information 21 recorded on the optical disc.

The apparatus performs bit inversion processing 30 on the reproduction conversion information 22 reproduced from the optical disc to generate reproduction coded information 12a. The bit inversion processing 30 inverts all the bits of each of six symbols ($e_9$ through $e_{14}$) of the reproduction conversion information 22 to obtain six symbols ($E_9$ through $E_{14}$). However, bit inversion processing is not performed on symbols ($e_5$ through $e_8$) included in the reproduction conversion information 22. As a result, the obtained reproduction coded information 12a includes the symbols ($e_5$ through $e_8$) non-converted. Due to this, the reproduction coded information 12a includes four symbol errors. The number of symbols which can be corrected by the Reed-Solomon code RS (15,8,8) is three or smaller. Therefore, the apparatus detects that the error correction of the reproduction coded information 12a is impossible and can determine that an error 23 has occurred on the stage of error correction without reproducing incorrect address information.

In this manner, even when an apparatus capable of performing the second bit inversion processing is used to reproduce information from an optical disc of a format not compatible to the apparatus, the first bit inversion processing is performed such that four or more symbol errors are caused. Owing to this, the apparatus can be prevented from obtaining an incorrect address and thus causing a malfunction.

Next, with reference to FIG. 6A, an operation with a format in which different symbols from those of the above example are bit-inverted by the first conversion mode will be described.

Figure 6A:
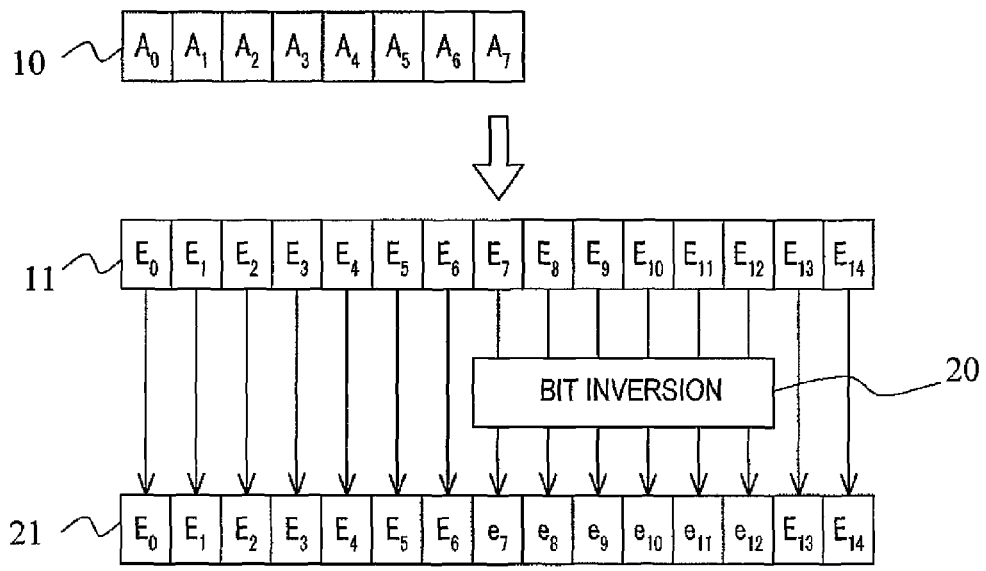
FIG. 6A shows processing of generating conversion information from error-correction-coded address information according to an embodiment of the present invention.

FIG. 6A shows processing of generating conversion information from error-correction-coded address information. Address information 10 represented by eight symbols ($A_0$ through $A_7$) is error-correction-coded to generate coded information 11.

Next, conversion of inverting all the bits of each of six symbols ($E_7$ through $E_{12}$) of the coded information 11 (bit inversion processing 20) is performed to generate conversion information 21. The six symbols ($E_7$ through $E_{12}$) are converted into symbols ($e_7$ through $e_{12}$). The generated conversion information 21 is recorded on an optical disc.

The processing of reproducing address information from an optical disc is basically the same as the processing described above with reference to FIG. 2B. In this example, as a result of the information reproduction from the optical disc, reproduction conversion information 22 including six bit-inverted symbols ($e_7$ through $e_{12}$) is obtained. Therefore, bit inversion processing 30 in this example which is inverse to the bit inversion processing 20 inverts all the bits of each of the six symbols ($e_7$ through $e_{12}$) of the reproduction conversion information 22 to obtain symbols ($E_7$ through $E_{12}$). As a result, reproduction coded information 12 including symbols ($E_0$ through $E_{14}$) is obtained. Some of the 15 symbols of the obtained reproduction coded information 12 may be reproduced with an incorrect value, but errors within three symbols are corrected by error correction processing. Thus, address information 10 is reproduced.

Figure 6B:
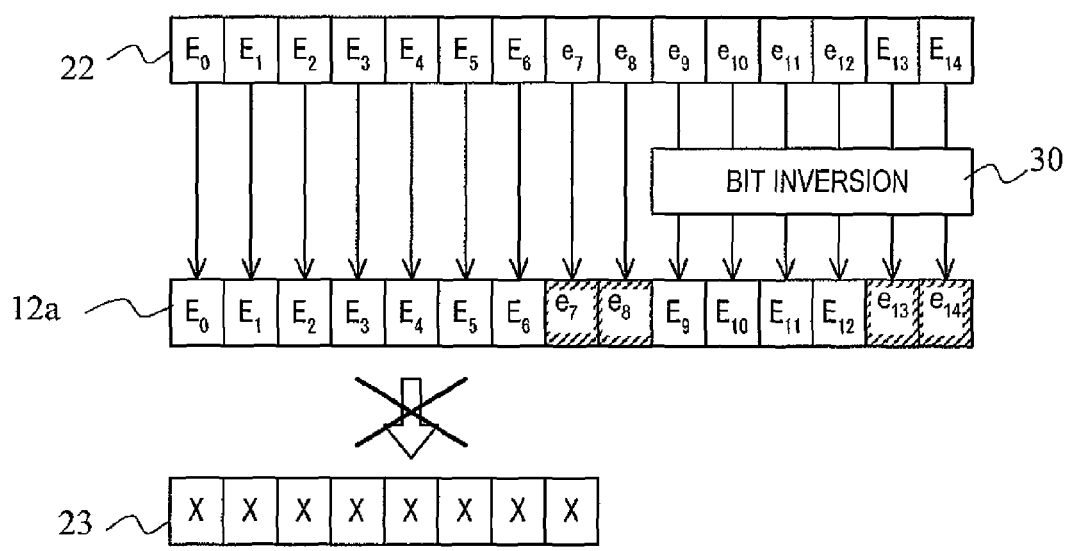
FIG. 6B shows a reproduction operation of an apparatus which is compatible to bit inversion processing of the second conversion mode but is not compatible to bit inversion processing of the first conversion mode according to an embodiment of the present invention.

Next, a reproduction operation of an apparatus which is compatible to the bit inversion processing of the second conversion mode but is not compatible to the bit inversion processing of the first conversion mode will be described. FIG. 6B shows a reproduction operation of such an apparatus.

Here, it is assumed that the bit inversion processing of the second conversion mode is the bit inversion processing described above with reference to FIGS. 3A and 3B, namely, the processing of performing bit inversion between the symbols ($E_9$ through $E_{14}$) and the symbols ($e_9$ through $e_{14}$).

As shown in FIG. 6B, information is reproduced from an optical disc to obtain reproduction conversion information 22. The reproduction conversion information 22 is obtained by reproducing the conversion information 21 recorded on the optical disc.

The apparatus performs bit inversion processing 30 on the reproduction conversion information 22 reproduced from the optical disc to generate reproduction coded information 12a. The bit inversion processing 30 inverts all the bits of each of six symbols ($e_9$ through $e_{12}$, $E_{13}$ through $E_{14}$) of the reproduction conversion information 22 to obtain six symbols ($E_9$ through $E_{12}$, $e_{13}$ through $e_{14}$). The symbols ($E_{13}$ through $E_{14}$) do not need to be bit-inverted but have been bit-inverted. The symbols ($e_7$ through $e_8$) included in the reproduction conversion information 22 are not bit-inverted. As a result, the obtained reproduction coded information 12a includes symbols ($e_7$ through $e_8$, $e_{13}$ through $e_{14}$). Due to this, the reproduction coded information 12a includes four symbol errors. The number of symbols which can be corrected by the Reed-Solomon code RS (15,8,8) is three or smaller. Therefore, the apparatus detects that the error correction of the reproduction coded information 12a is impossible and can determine that an error 23 has occurred on the stage of error correction without reproducing incorrect address information.

Unlike in Embodiment 1, where both of the first conversion mode and the second conversion mode are capable of performing bit inversion, it is not sufficient to set the number of symbols to be bit-inverted to be larger than the number of symbols which can be corrected by the Reed-Solomon code RS (15,8,8). The positions to be bit-inverted by the first conversion mode is set in consideration of the positions to be bit-inverted by the second conversion mode. Namely, the first conversion mode is set such that a distance between first information obtained by performing inverse conversion to the first conversion mode on the conversion information, and second information obtained by performing inverse conversion to the second conversion mode, which is different from the first conversion mode, on the conversion information, is at least ½ of a minimum free distance of the error correction code.

In this specification, when conversion information which is generated by the first conversion mode and recorded on an optical disc is reproduced by inverse conversion by a reproducing apparatus for performing the second conversion mode, the number of symbol errors exceeding the number of symbols which can be corrected by the Reed-Solomon code RS (15,8,8) is caused, so that a malfunction is prevented. Needless to say, substantially the same effect of preventing the malfunction is provided even when conversion information which is generated by the second conversion mode and recorded on an optical disc is reproduced by inverse conversion by a reproducing apparatus for performing the first conversion mode.

(Embodiment 3)

In Embodiments 1 and 2, bit inversion processing is performed on m number of consecutive symbols. In this embodiment, two or more separate symbol groups are bit-inverted (namely, there is at least one symbol which is not to be bit-inverted among m number of symbols to be bit-inverted).

A plurality of symbols to be bit-inverted are divided into k number (k is an integer of 2 or greater) of symbol groups which are not adjacent to each other. Between the two symbol groups, there is(are) p number (p is an integer of 1 or greater) of symbol(s). One of the symbol groups includes at least one of symbols C(2), C(3) and C(12).

Figure 7A:
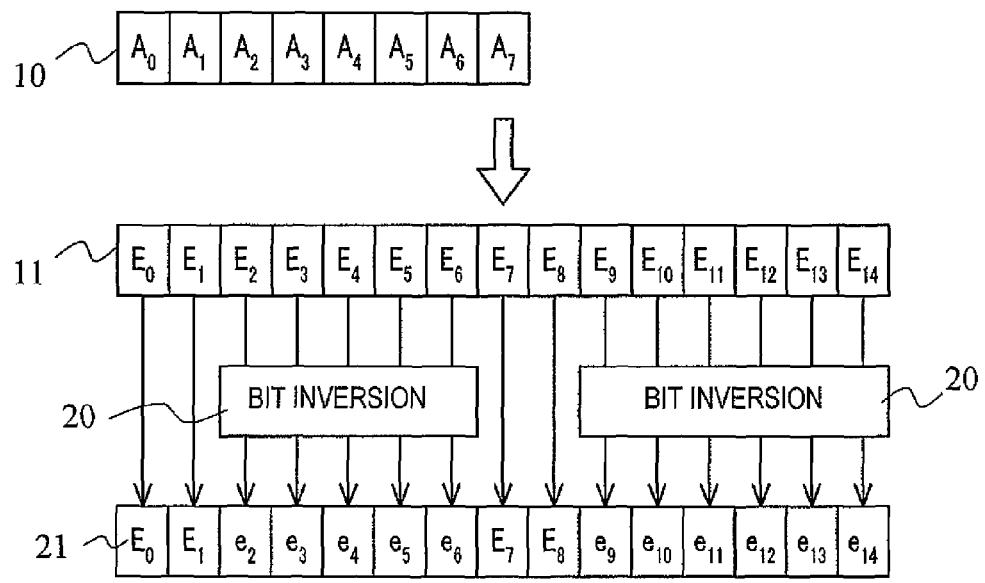
FIG. 7A shows processing of generating conversion information from error-correction-coded address information according to an embodiment of the present invention.

First, with reference to FIG. 7A, processing of generating conversion information 21 subjected to bit inversion processing by the first conversion mode will be described. Address information 10 represented by eight symbols ($A_0$ through $A_7$) is error-correction-coded to generate coded information 11.

Next, conversion of inverting all the bits of each of 11 symbols ($E_2$ through $E_6$, $E_9$ through $E_{14}$) of the coded information 11 (bit inversion processing 20) is performed to generate conversion information 21. The symbols to be bit-inverted are divided into two blocks of the symbols ($E_2$ through $E_6$) and the symbols ($E_9$ through $E_{14}$).

The 11 symbols ($E_2$ through $E_6$, $E_9$ through $E_{14}$) are converted into symbols ($e_2$ through $e_6$, $e_9$ through $e_{14}$). The generated conversion information 21 is recorded on an optical disc.

The processing of reproducing address information from an optical disc is performed by bit inversion processing 30 which is inverse to the bit inversion processing 20 as described above with reference to FIG. 2B. Conversion of inverting all the bits of each of the 11 symbols ($e_2$ through $e_6$, $e_9$ through $e_{14}$) of the reproduction conversion information 22 is performed to obtain symbols ($E_2$ through $E_6$, $E_9$ through $E_{14}$). As a result, reproduction coded information 12 including symbols ($E_0$ through $E_{14}$) is obtained. Errors within three symbols are corrected by error correction processing. Thus, address information 10 is reproduced.

Figure 7B:
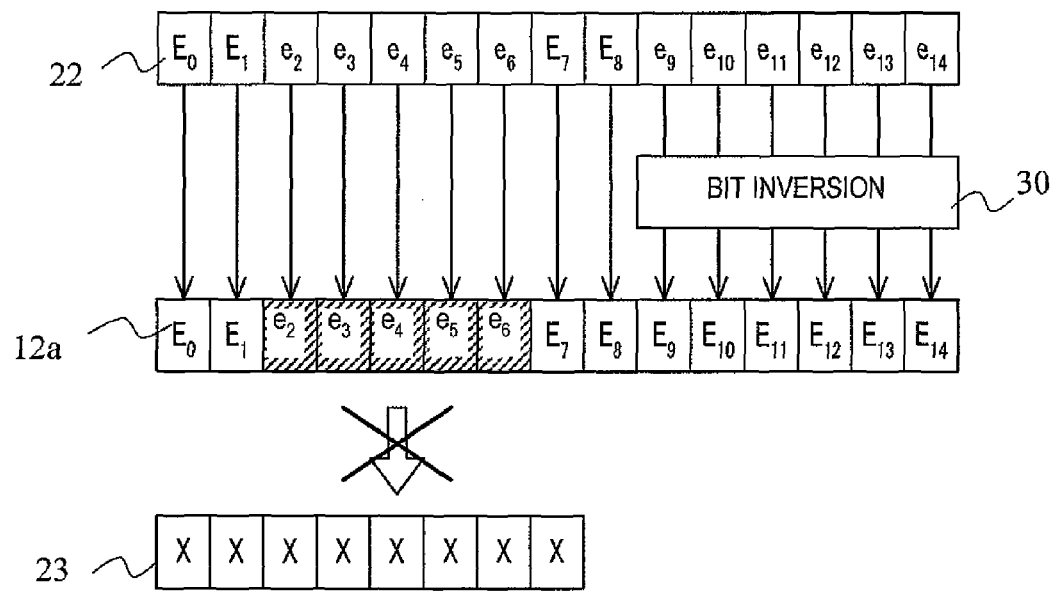
FIG. 7B shows a reproduction operation of an apparatus which is compatible to bit inversion processing of the second conversion mode but is not compatible to bit inversion processing of the first conversion mode according to an embodiment of the present invention.

Next, a reproduction operation of an apparatus which is compatible to the bit inversion processing of the second conversion mode but is not compatible to the bit inversion processing of the first conversion mode will be described. FIG. 7B shows a reproduction operation of such an apparatus.

Here, it is assumed that the bit inversion processing of the second conversion mode is the bit inversion processing described above with reference to FIGS. 3A and 3B, namely, the processing of performing bit inversion between the symbols ($E_9$ through $E_{14}$) and the symbols ($e_9$ through $e_{14}$).

As shown in FIG. 7B, information is reproduced from an optical disc to obtain reproduction conversion information 22. The reproduction conversion information 22 is obtained by reproducing the conversion information 21 recorded on the optical disc.

The apparatus performs bit inversion processing 30 on the reproduction conversion information 22 reproduced from the optical disc to generate reproduction coded information 12a. The bit inversion processing 30 inverts all the bits of each of six symbols ($e_9$ through $e_{14}$) of the reproduction conversion information 22 to obtain six symbols ($E_9$ through $E_{14}$). However, bit inversion processing is not performed on symbols ($e_2$ through $e_6$) included in the reproduction conversion information 22. As a result, the obtained reproduction coded information 12a includes the symbols ($e_2$ through $e_6$). Due to this, the reproduction coded information 12a includes five symbol errors. The number of symbols which can be corrected by the Reed-Solomon code RS (15,8,8) is three or smaller. Therefore, the apparatus detects that the error correction of the reproduction coded information 12a is impossible and can determine that an error 23 has occurred on the stage of error correction without reproducing incorrect address information.

Next, with reference to FIG. 8A, an operation with a format in which different symbols from those of the above example are bit-inverted by the first conversion mode will be described.

Figure 8A:
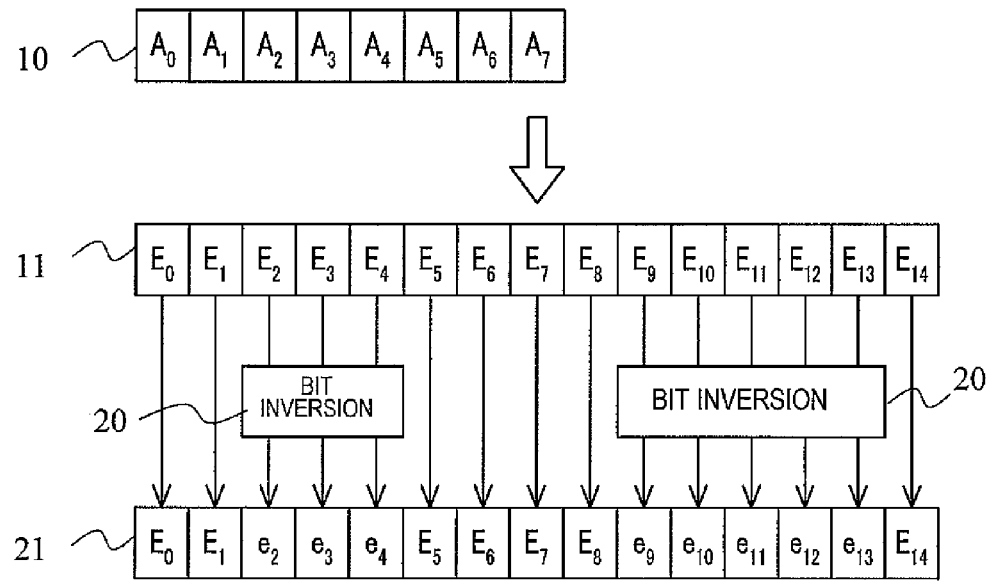
FIG. 8A shows processing of generating conversion information from error-correction-coded address information according to an embodiment of the present invention.

FIG. 8A shows processing of generating conversion information from error-correction-coded address information. Address information 10 represented by eight symbols ($A_0$ through $A_7$) is error-correction-coded to generate coded information 11.

Next, conversion of inverting all the bits of each of eight symbols ($E_2$ through $E_4$, $E_9$ through $E_{13}$) of the coded information 11 (bit inversion processing 20) is performed to generate conversion information 21. The symbols to be bit-inverted are divided into two blocks of the symbols ($E_2$ through $E_4$) and the symbols ($E_9$ through $E_{13}$).

The eight symbols ($E_2$ through $E_4$, $E_9$ through $E_{13}$) are converted into symbols ($e_2$ through $e_4$, $e_9$ through $e_{13}$). The generated conversion information 21 is recorded on an optical disc.

The processing of reproducing address information from an optical disc is performed by bit inversion processing 30 which is inverse to the bit inversion processing 20 as described above with reference to FIG. 2B. Conversion of inverting all the bits of each of the eight symbols ($e_2$ through $e_4$, $e_9$ through $e_{13}$) of the reproduction conversion information 22 is performed to obtain symbols ($E_2$ through $E_4$, $E_9$ through $E_{13}$). As a result, reproduction coded information 12 including symbols ($E_0$ through $E_{14}$) is obtained. Errors within three symbols are corrected by error correction processing. Thus, address information 10 is reproduced.

Figure 8B:
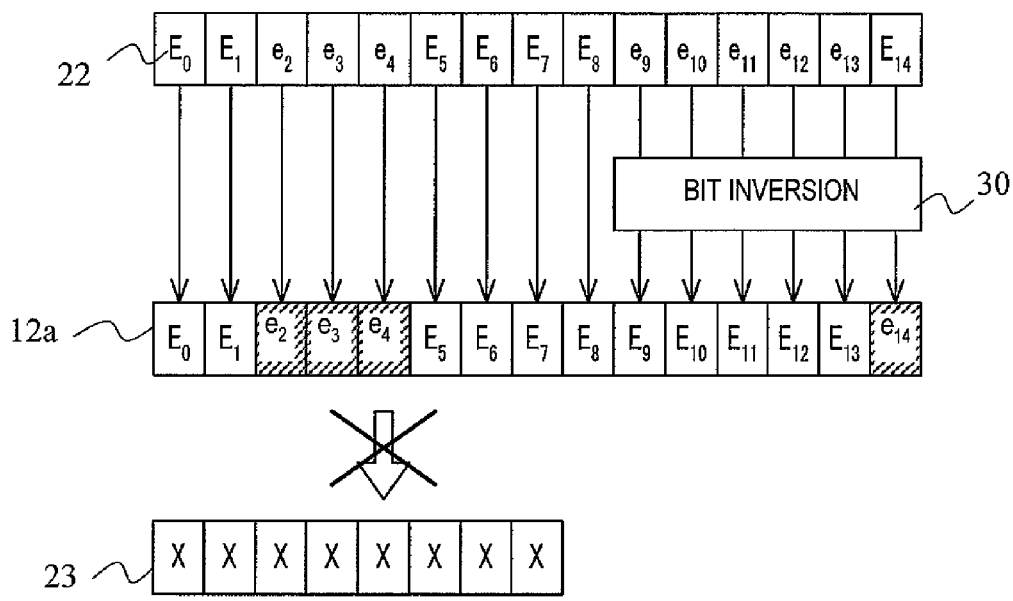
FIG. 8B shows a reproduction operation of an apparatus which is compatible to bit inversion processing of the second conversion mode but is not compatible to bit inversion processing of the first conversion mode according to an embodiment of the present invention.

Next, a reproduction operation of an apparatus which is compatible to the bit inversion processing of the second conversion mode but is not compatible to the bit inversion processing of the first conversion mode will be described. FIG. 8B shows a reproduction operation of such an apparatus.

Here, it is assumed that the bit inversion processing of the second conversion mode is the bit inversion processing described above with reference to FIGS. 3A and 3B, namely, the processing of performing bit inversion between the symbols ($E_9$ through $E_{14}$) and the symbols ($e_9$ through $e_{14}$).

As shown in FIG. 8B, information is reproduced from an optical disc to obtain reproduction conversion information 22. The reproduction conversion information 22 is obtained by reproducing the conversion information 21 recorded on the optical disc.

The apparatus performs bit inversion processing 30 on the reproduction conversion information 22 reproduced from the optical disc to generate reproduction coded information 12a. The bit inversion processing 30 inverts all the bits of each of six symbols ($e_9$ through $e_{13}$, $E_{14}$) of the reproduction conversion information 22 to obtain six symbols ($E_9$ through $E_{13}$, $e_{14}$). The symbol ($E_{14}$) does not need to be bit-inverted but has been bit-inverted. The symbols ($e_2$ through $e_4$) included in the reproduction conversion information 22 are not bit-inverted. As a result, the obtained reproduction coded information 12a includes symbols ($e_2$ through $e_4$, $e_{14}$). Due to this, the reproduction coded information 12a includes four symbol errors. The number of symbols which can be corrected by the Reed-Solomon code RS (15,8,8) is three or smaller. Therefore, the apparatus detects that the error correction of the reproduction coded information 12a is impossible and can determine that an error 23 has occurred on the stage of error correction without reproducing incorrect address information.

Next, an example in which the symbols to be bit-inverted are divided into three or more symbol groups will be described. One of the symbol groups includes symbols C(2) and C(3). In this example, the symbols are divided into three symbol groups.

Figure 9A:
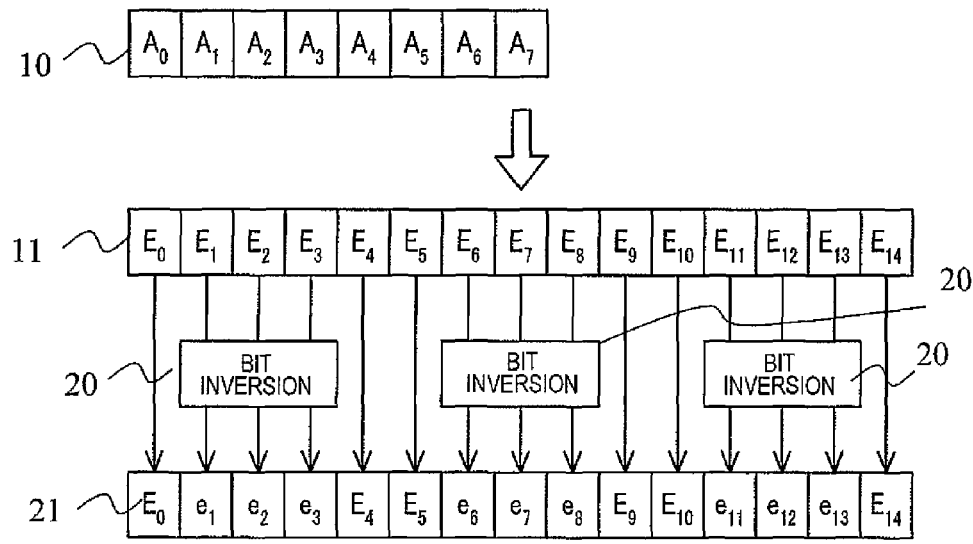
FIG. 9A shows processing of generating conversion information from error-correction-coded address information according to an embodiment of the present invention.

First, with reference to FIG. 9A, processing of generating conversion information 21 subjected to bit inversion processing by the first conversion mode will be described. Address information 10 represented by eight symbols ($A_0$ through $A_7$) is error-correction-coded to generate coded information 11.

Next, conversion of inverting all the bits of each of nine symbols ($E_1$ through $E_3$, $E_6$ through $E_8$, $E_{11}$ through $E_{13}$) of the coded information 11 (bit inversion processing 20) is performed to generate conversion information 21. The symbols to be bit-inverted are divided into three blocks of the symbols ($E_1$ through $E_3$), the symbols ($E_6$ through $E_8$) and the symbols ($E_{11}$ through $E_{13}$).

The nine symbols ($E_1$ through $E_3$, $E_6$ through $E_8$, $E_{11}$ through $E_{13}$) are converted into symbols ($e_1$ through $e_3$, $e_6$ through $e_8$, $e_{11}$ through $e_{13}$). The generated conversion information 21 is recorded on an optical disc.

The processing of reproducing address information from an optical disc is performed by bit inversion processing 30 which is inverse to the bit inversion processing 20 as described above with reference to FIG. 2B. Conversion of inverting all the bits of each of the nine symbols ($e_1$ through $e_3$, $e_6$ through $e_8$, $e_{11}$ through $e_{13}$) of the reproduction conversion information 22 is performed to obtain symbols ($E_1$ through $E_3$, $E_6$ through $E_8$, $E_{11}$ through $E_{13}$). As a result, reproduction coded information 12 including symbols ($E_0$ through $E_{14}$) is obtained. Errors within three symbols are corrected by error correction processing. Thus, address information 10 is reproduced.

Figure 9B:
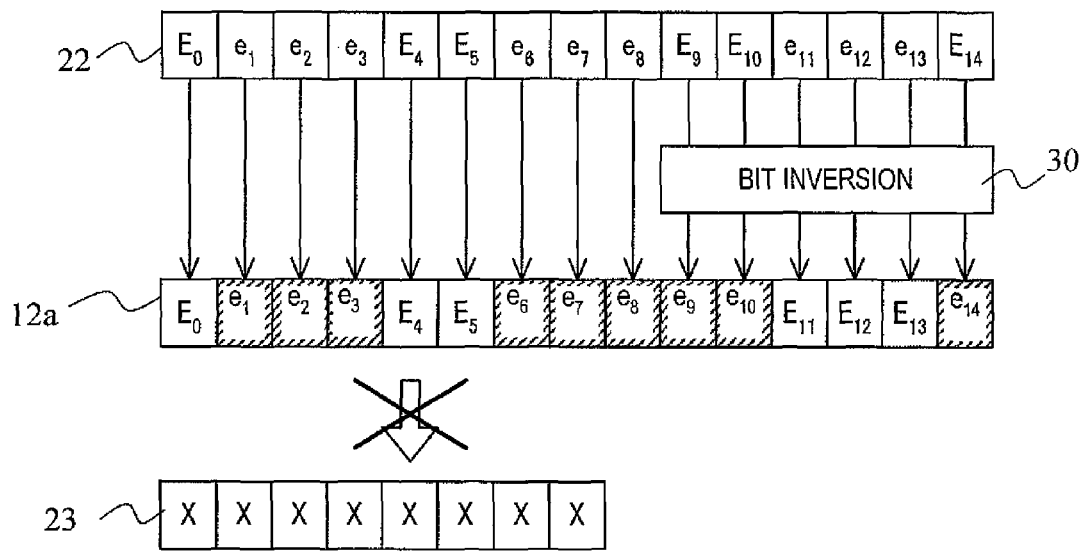
FIG. 9B shows a reproduction operation of an apparatus which is compatible to bit inversion processing of the second conversion mode but is not compatible to bit inversion processing of the first conversion mode according to an embodiment of the present invention.

Next, a reproduction operation of an apparatus which is compatible to the bit inversion processing of the second conversion mode but is not compatible to the bit inversion processing of the first conversion mode will be described. FIG. 9B shows a reproduction operation of such an apparatus.

Here, it is assumed that the bit inversion processing of the second conversion mode is the bit inversion processing described above with reference to FIGS. 3A and 3B, namely, the processing of performing bit inversion between the symbols ($E_9$ through $E_{14}$) and the symbols ($e_9$ through $e_{14}$).

As shown in FIG. 9B, information is reproduced from an optical disc to obtain reproduction conversion information 22. The reproduction conversion information 22 is obtained by reproducing the conversion information 21 recorded on the optical disc.

The apparatus performs bit inversion processing 30 on the reproduction conversion information 22 reproduced from the optical disc to generate reproduction coded information 12a. The bit inversion processing 30 inverts all the bits of each of six symbols ($E_9$ through $E_{10}$, $e_{11}$ through $e_{13}$, $E_{14}$) of the reproduction conversion information 22 to obtain six symbols ($e_9$ through $e_{10}$, $E_{11}$ through $E_{13}$, $e_{14}$). The symbols ($E_9$ through $E_{10}$, $E_{14}$) do not need to be bit-inverted but have been bit-inverted. The symbols ($e_1$ through $e_3$, $e_6$ through $e_8$) included in the reproduction conversion information 22 are not bit-inverted. As a result, the obtained reproduction coded information 12a includes symbols ($e_1$ through $e_3$, $e_6$ through $e_{10}$, $e_{14}$). Due to this, the reproduction coded information 12a includes nine symbol errors. The number of symbols which can be corrected by the Reed-Solomon code RS (15,8,8) is three or smaller. Therefore, the apparatus detects that the error correction of the reproduction coded information 12a is impossible and can determine that an error 23 has occurred on the stage of error correction without reproducing incorrect address information.

Next, with reference to FIG. 10A, an operation with a format in which different symbols from those of the above examples are bit-inverted by the first conversion mode will be described.

Figures 10A, 10B:
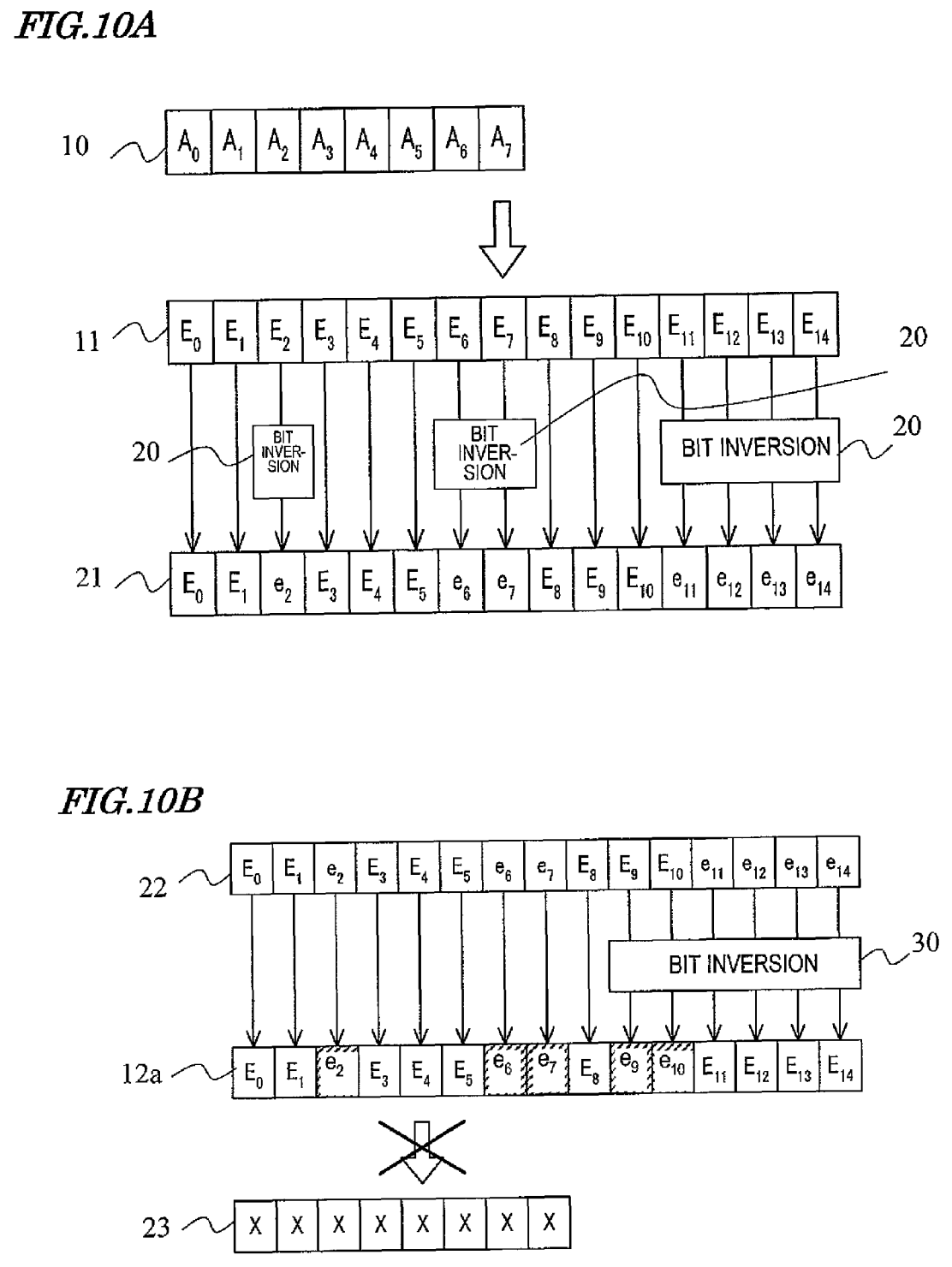

FIG. 10A shows processing of generating conversion information from error-correction-coded address information. Address information 10 represented by eight symbols ($A_0$ through $A_7$) is error-correction-coded to generate coded information 11.

Next, conversion of inverting all the bits of each of seven symbols ($E_2$, $E_6$ through $E_7$, $E_{11}$ through $E_{14}$) of the coded information 11 (bit inversion processing 20) is performed to generate conversion information 21. The symbols to be bit-inverted are divided into three blocks of the symbols ($E_2$), the symbols ($E_6$ through $E_7$) and the symbols ($E_{11}$ through $E_{14}$).

The seven symbols ($E_2$, $E_6$ through $E_7$, $E_{11}$ through $E_{14}$) are converted into symbols ($e_2$, $e_6$ through $e_7$, $e_{11}$ through $e_{14}$). The generated conversion information 21 is recorded on an optical disc.

The processing of reproducing address information from an optical disc is performed by bit inversion processing 30 which is inverse to the bit inversion processing 20 as described above with reference to FIG. 2B. Conversion of inverting all the bits of each of the seven symbols ($e_2$, $e_6$ through $e_7$, $e_{11}$ through $e_{14}$) of the reproduction conversion information 22 is performed to obtain symbols ($E_2$, $E_6$ through $E_7$, $E_{11}$ through $E_{14}$). As a result, reproduction coded information 12 including symbols ($E_0$ through $E_{14}$) is obtained. Errors within three symbols are corrected by error correction processing. Thus, address information 10 is reproduced.

Next, a reproduction operation of an apparatus which is compatible to the bit inversion processing of the second conversion mode but is not compatible to the bit inversion processing of the first conversion mode will be described. FIG. 10B shows a reproduction operation of such an apparatus.

Here, it is assumed that the bit inversion processing of the second conversion mode is the bit inversion processing described above with reference to FIGS. 3A and 3B, namely, the processing of performing bit inversion between the symbols ($E_9$ through $E_{14}$) and the symbols ($e_9$ through $e_{14}$).

As shown in FIG. 10B, information is reproduced from an optical disc to obtain reproduction conversion information 22. The reproduction conversion information 22 is obtained by reproducing the conversion information 21 recorded on the optical disc.

The apparatus performs bit inversion processing 30 on the reproduction conversion information 22 reproduced from the optical disc to generate reproduction coded information 12a. The bit inversion processing 30 inverts all the bits of each of six symbols ($E_9$ through $E_{10}$, $e_{11}$ through $e_{14}$) of the reproduction conversion information 22 to obtain six symbols ($e_9$ through $e_{10}$, $E_{11}$ through $E_{14}$). The symbols ($E_9$ through $E_{10}$) do not need to be bit-inverted but have been bit-inverted. The symbols ($e_2$, $e_6$ through $e_7$) included in the reproduction conversion information 22 are not bit-inverted. As a result, the obtained reproduction coded information 12a includes symbols ($e_2$, $e_6$ through $e_7$, $e_9$ through $e_{10}$). Due to this, the reproduction coded information 12a includes five symbol errors. The number of symbols which can be corrected by the Reed-Solomon code RS (15,8,8) is three or smaller. Therefore, the apparatus detects that the error correction of the reproduction coded information 12a is impossible and can determine that an error 23 has occurred on the stage of error correction without reproducing incorrect address information.

Next, a format X representing a layer number and address information with four symbols ($A_0$, $A_1$, $A_2$, $A_3$) will be described. Such address information can be recorded on an information recording medium as, for example, an AUN (Address Unit Number) address. An AUN address is inserted into user data and is recorded on the information recording medium together with the user data.

Figure 10C:
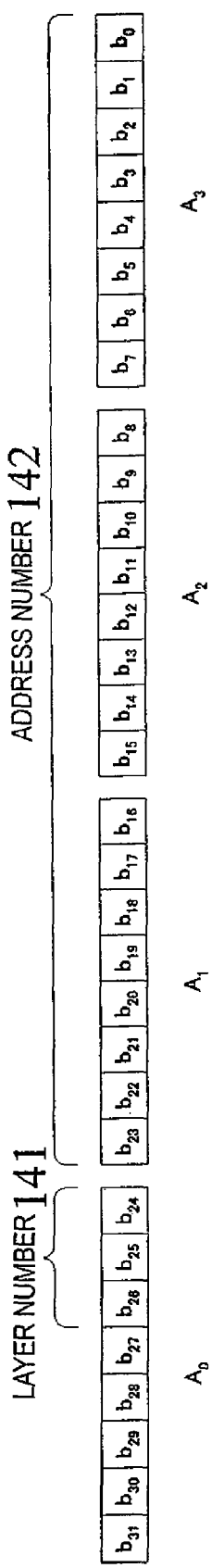
FIG. 10C shows bit locations in symbols representing address information according to an embodiment of the present invention.

FIG. 10C shows bit locations of symbols $A_0$ through $A_3$ of the address information by the format X. 24 bits of $b_{23}$ through $b_0$ represent an address number, and 3 bits of $b_{26}$ through $b_{24}$ represent a layer number.

The address information includes five symbols of $A_0$ through $A_4$, and the symbols $A_0$ through $A_3$ include a layer number 141 and an address number 142 with the bit locations shown in FIG. 10C. At $A_4$, additional information is stored. In this example, it is assumed that the additional information is "0". Coded information is generated by adding four parity symbols to the address information, and forms an error correction code. The parities may be added by a known method of forming an error correction code. Here, a Reed-Solomon code RS (9,5,5) is used as an example. The error correction code can correct up to two symbol errors. The generated coded information is recorded on an optical disc.

Figure 10D:
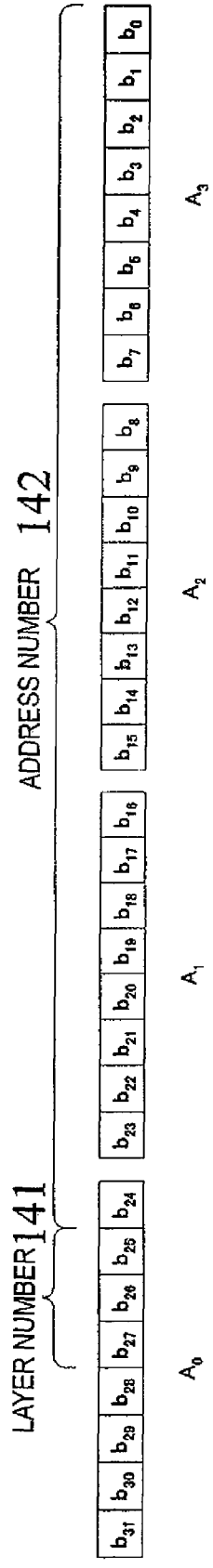
FIG. 10D shows bit locations in symbols representing address information according to an embodiment of the present invention.

Next, a format Y, which is different from the format X, will be described. FIG. 10D shows bit locations of symbols $A_0$ through $A_3$ of the address information by the format Y. 25 bits of $b_{24}$ through $b_0$ represent an address number, and 3 bits of $b_{27}$ through $b_{25}$ represent a layer number. The recording capacity of an optical disc to which the format Y is applied is larger than the recording capacity of an optical disc to which the format X is applied.

The procedure of generating the conversion information by the format Y is substantially the same as that by the format X. The symbols $A_0$ through $A_3$ include a layer number 141 and an address number 142 with the bit locations shown in FIG. 10D.

Next, an operation by which an apparatus which is compatible to the format X but is not compatible to the format Y reproduces information from an optical disc of the format Y will be described.

The format X and the format Y are different from each other only in the bit locations of the layer number 141 and the address number 142 as shown in FIG. 10C and FIG. 10D, and are the same in the method of adding parities and the method of recording information on the optical disc. Therefore, the operation of performing error correction to generate error-correction-coded information is the same as the operation for the optical disc of the format X.

For reproducing address information from the error-correction-coded information, the layer number and the address number are obtained in accordance with the bit locations shown in FIG. 10C. However, the error-correction-coded information includes the layer number and the address number with the bit locations shown in FIG. 10D, and thus incorrect layer number and address number are obtained.

Figure 10E:
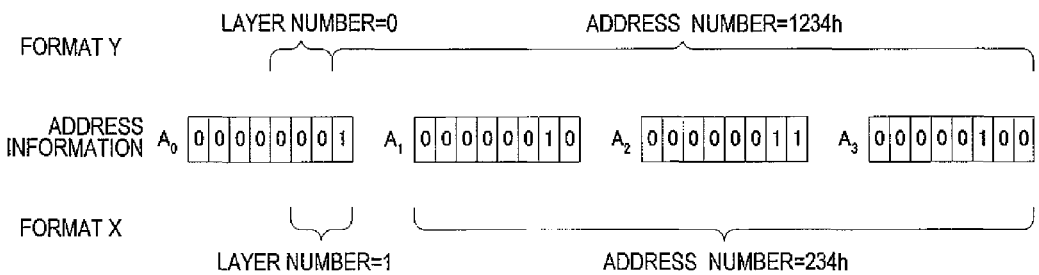
FIG. 10E shows an operation of obtaining an incorrect layer number and an incorrect address number according to an embodiment of the present invention.

For example, when information including layer number 0 and address number 1234h with the format Y as shown in FIG. 10E is reproduced based on the format X, the layer number is 1 and the address number is 234h. Thus, incorrect layer number and address number are obtained. In order to avoid such incorrect information from being obtained, the bit inversion processing according to the present invention is useful.

Figure 10F:
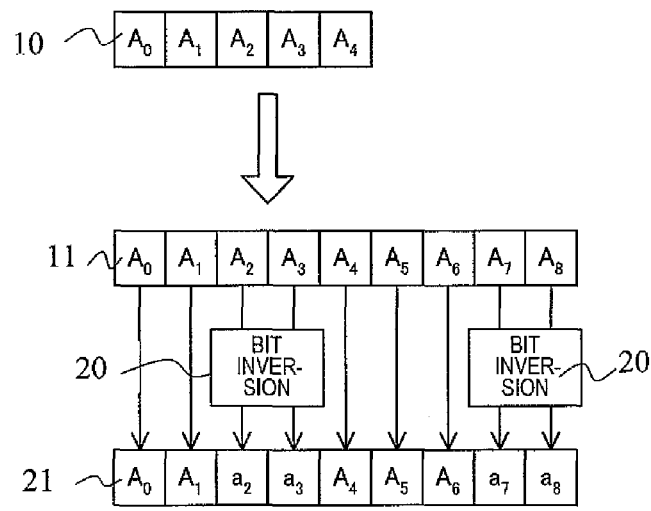
FIG. 10F shows processing of generating conversion information from error-correction-coded address information according to an embodiment of the present invention.

FIG. 10F shows a procedure of generating conversion information when the format Y is used. Five symbols ($A_0$ through $A_4$) are error-correction-coded by the Reed-Solomon code RS (15,8,8) to generate coded information 11 including added four parity symbols ($A_5$ through $A_8$).

Next, conversion of inverting all the bits of each of four symbols ($A_2$, $A_3$, $A_7$, $A_8$) of the coded information 11 (bit inversion processing 20) is performed to generate conversion information 21. The four symbols ($A_2$, $A_3$, $A_7$, $A_8$) are converted into symbols ($a_2$, $a_3$, $a_7$, $a_8$). The generated conversion information 21 is recorded on an optical disc.

When the conversion information 21 is reproduced, the reproduction information includes the symbols ($a_2$, $a_3$, $a_7$, $a_8$). Therefore, when the reproduction is performed by an apparatus which does not have a function of performing bit inversion processing, an error occurs as described above. In this manner, the coded information is converted into conversion information using a conversion method by which a number of symbols exceeding the correction capability of the error correction code are not recovered to the original symbols, and the obtained conversion information is recorded on an optical disc. Thus, an error can be detected by error correction processing without incorrect address information being reproduced. FIG. 10F shows an example in which bit inversion processing is performed on two blocks. Even where bit inversion processing is performed on one block or three or more blocks, as long as the conversion method of causing a number of errors exceeding the number which can be corrected is used, error detection can be realized by the error correction processing.

In the case where the quality of a reproduction signal is very good, the probability at which the reproduction coded information includes an error is decreased. An operation by which an apparatus not compatible to the first conversion mode reproduces information from an optical disc of the first conversion mode without performing error correction in such a case will be described.

Address numbers are generally assigned so as to monotonously increase or monotonously decrease in a scanning direction. Here, it is assumed that the address numbers are assigned so as to monotonously increase both in the first and second conversion modes.

Figure 10G:
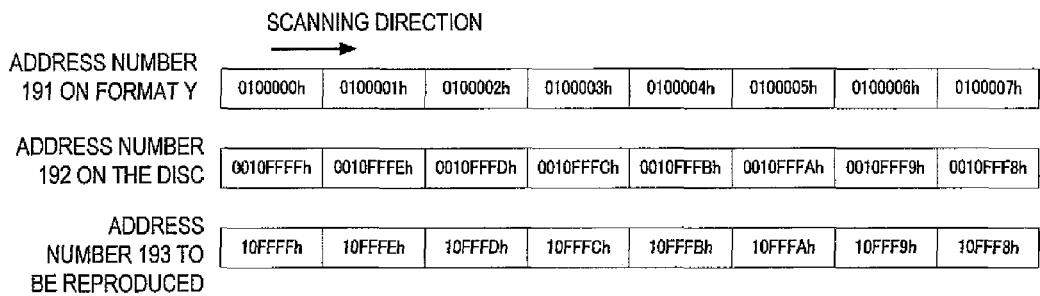
FIG. 10G shows address numbers and address information according to an embodiment of the present invention.

As shown in FIG. 10G, it is assumed that address numbers 191 on the format Y are assigned to layer number 0 as 0100000h, 0100001h, . . . , 0100007h in the scanning direction. In the address information 192 on the optical disc, symbols corresponding to the address numbers are 0010FFFFh, 0010FFFEh, . . . , 0010FFF8h. When these are reproduced by an apparatus not compatible to the first conversion mode without performing error correction, reproduced address information 193 includes address numbers 10FFFFh, 10FFFEh, . . . , 10FFF8h, which do not monotonously increase in the scanning direction. Owing to this, an error can be detected and thus incorrect data recording or reproduction can be prevented.

In the case of a general optical disc, for reproducing data recorded at address 00123400h, the optical spot is first moved to a position before address 00123400h. Then, the track is scanned to check the address, and the timing for obtaining the data is determined with the premise that addresses are continuous and thus address 00123400h follows addresses 001233FEh and 001233FFh. Accordingly, when non-continuous addresses are reproduced, the position or timing at which recording/reproduction is to be started cannot be determined. Therefore, data cannot be recorded or reproduced.

In this manner, in order to prevent incorrect recording or reproduction from being performed by an information reproducing apparatus which is not compatible to the first conversion mode, a symbol including at least the least significant bit of the address number should be bit-inverted.

(Embodiment 4)

In the above embodiment, the first conversion mode, by which the number of errors caused when the bit inversion processing of the second conversion mode is performed is four or greater, is described. Owing to this, an apparatus compatible to the bit inversion processing of the second conversion mode but not compatible to the bit inversion processing of the first conversion mode can be prevented from obtaining an incorrect address and thus causing a malfunction.

Hereinafter, further effects provided by dividing the symbols to be bit-inverted into two or more blocks will be described. First, problems which may possibly occur where the symbols to be bit-inverted are included in only one block will be described.

Figure 11:
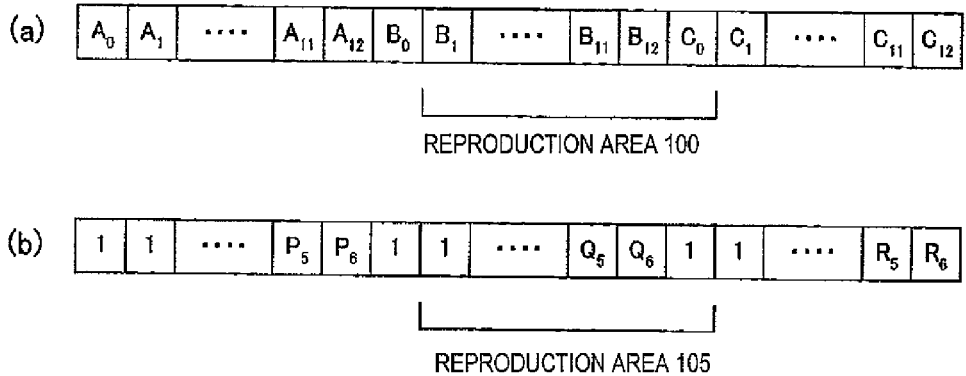
FIGS. 11(a) and (b) each show a synchronization-shifted reproduction area according to an embodiment of the present invention.
Figure 12:
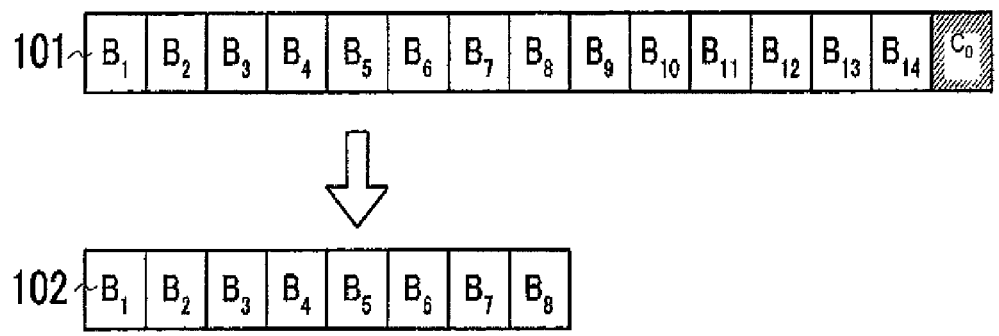
FIG. 12 shows a procedure of reproducing incorrect address information according to an embodiment of the present invention.

A Reed-Solomon code is a cyclic code, and therefore has a problem of making a correction incorrectly even when a synchronization shift occurs, as described below. For example, for a DVD+RW disc, address information $A(A_0, A_1, \ldots, A_6, A_7)$, $B(B_0, B_1, \ldots, B_6, B_7)$, $C(C_0, C_1, \ldots, C_6, C_7)$ are coded by a Reed-Solomon code RS (13,8,6) to generate coded information $(A_0, A_1, \ldots, A_{11}, A_{12})$, $(B_0, B_1, \ldots, B_{11}, B_{12})$, $(C_0, C_1, \ldots, C_{11}, C_{12})$. It is assumed that when reproduction is performed from an optical disc having such coded information recorded thereon as shown in FIG. 11($a$), a synchronization shift occurs and a reproduction area 100 is reproduced. As shown in FIG. 12, $(B_1, \ldots, B_{11}, B_{12}, C_0)$ is obtained as reproduction information 101. Because of the nature of a cyclic code, where $(B_0, B_1, \ldots, B_{11}, B_{12})$ is a code word, $(0, B_0, B_1, \ldots, B_{13}, B_{14}, 0)$ obtained by cyclically shifting a non-shortened code word $(0, 0, B_0, \ldots, B_{11}, B_{12})$ is also a non-shortened code word. Therefore, $(B_1, \ldots, B_{11}, B_{12}, 0)$ is also a code word. Namely, when one or more symbol errors of the reproduction information 101 are corrected, one symbol error $C_0$ is corrected to $B_0$ and $(B_1, \ldots, B_{11}, B_{12}, 0)$ is obtained as a correction result. In consequence, incorrect address information $(B_1, B_2, \ldots, B_7, B_8)$ is reproduced, and it cannot be detected by the error correction processing that this address information is incorrect.

There is also the following problem. When the Reed-Solomon code (15,8,8) is used, consecutive address information (1,1,1,1,1,1,1,1), (1,1,1,1,1,1,1,2), (1,1,1,1,1,1,1,3) are coded into coded information $(1,1,1,1,1,1,1,1,P_0,P_1,P_2,P_3,P_4,P_5,P_6)$, $(1,1,1,1,1,1,1,2,Q_0,Q_1,Q_2,Q_3,Q_4,Q_5,Q_6)$, $(1,1,1,1,1,1,1,3,R_0,R_1,R_2,R_3,R_4,R_5,R_6)$. It is assumed that when reproduction is performed from an optical disc having such coded information recorded thereon as shown in FIG. 11($b$), a synchronization shift occurs and a reproduction area 105 is reproduced. $(1,1,1,1,1,1,2,Q_0,Q_1,Q_2,Q_3,Q_4,Q_5,Q_6,1)$ is obtained as reproduction information. Because of the nature of a cyclic code, where $(1,1,1,1,1,1,1,2,Q_0,Q_1,Q_2,Q_3,Q_4,Q_5,Q_6)$ is a code word, $(1,1,1,1,1,1,2,Q_0,Q_1,Q_2,Q_3,Q_4,Q_5,Q_6,1)$ is also a code word. Namely, even when reproduction information is error-corrected in order to detect an error, the error is not detected and incorrect address information $(1,1,1,1,1,1,2,Q_0)$ is reproduced.

In an embodiment of the present invention, a mode of dividing the symbols to be bit-inverted into two blocks is adopted. Owing to this, even when a synchronization shift as described above occurs, an error can be detected without incorrect address information being reproduced. This will be described below in detail.

Figure 13:
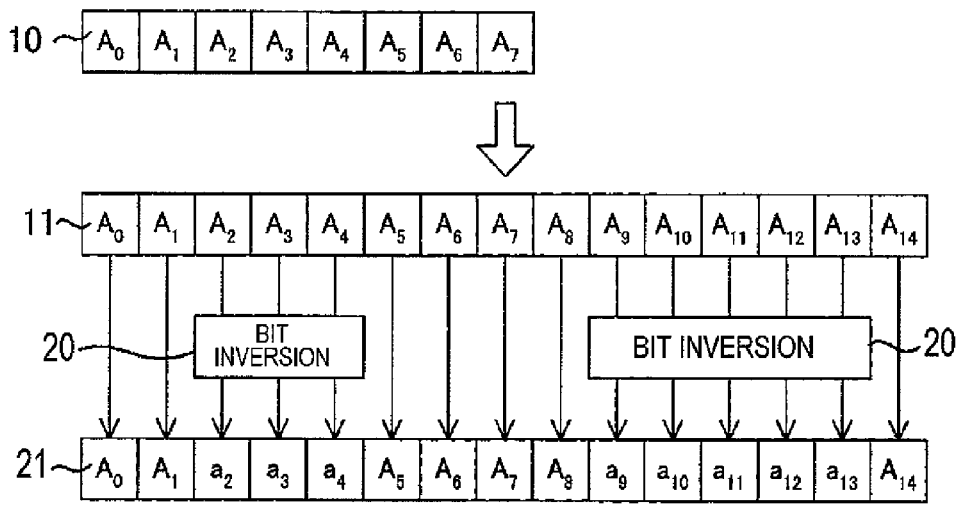
FIG. 13 shows a procedure of generating conversion information according to an embodiment of the present invention.

FIG. 13 shows a procedure of generating conversion information according to Embodiment 4 of the present invention.

Figure 14:
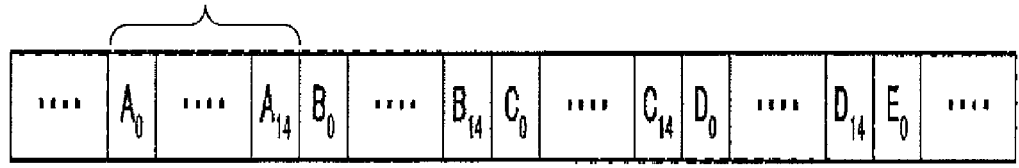
FIG. 14 shows a conversion information stream recorded on a recording medium according to an embodiment of the present invention.

Address information 10 of $A(A_0, A_1, A_2, A_3, A_4, A_5, A_6, A_7)$ shown in FIG. 13 is error-correction-coded by the Reed-Solomon code RS (15,8,8) to generate coded information 11 including added seven parity symbols. Conversion of inverting all the bits of each of symbols $A_2, A_3, A_4, A_9, A_{10}, A_{11}, A_{12}, A_{13}$ of the coded information 11 (bit inversion processing 20) is performed to generate conversion information 21. Here, $a_x$ represents a symbol obtained by inverting all the bits of $A_x$. The conversion information 21 generated in this manner is recorded on an optical disc. The conversion information may be recorded using a known system, for example, ADIP used for a DVD+RW disc. As shown in FIG. 14, pieces of conversion information 21 generated from different pieces of address information 10 are recorded on the optical disc sequentially. FIG. 14 shows a stream of such pieces of conversion information recorded on the optical disc.

Figure 15:
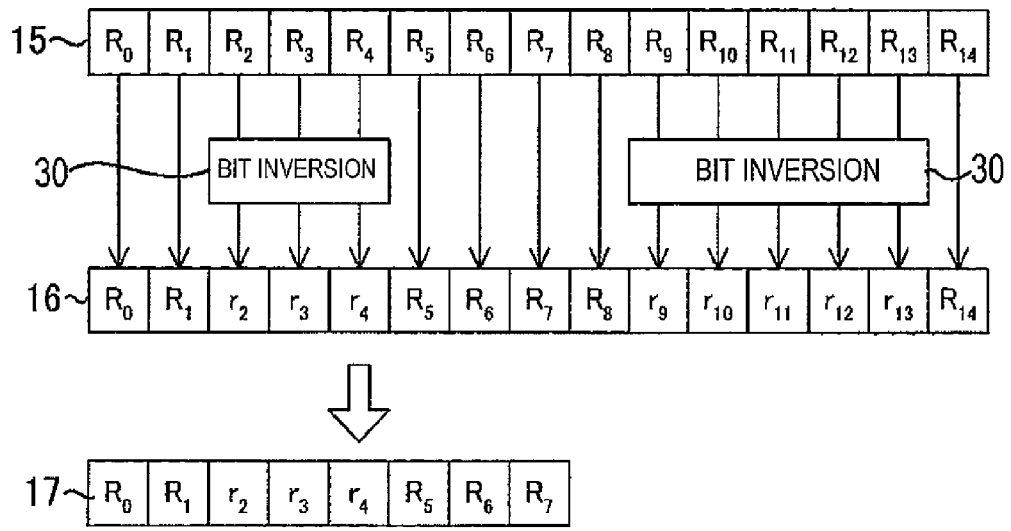
FIG. 15 shows a procedure of reproducing address information from conversion information reproduced from a recording medium according to an embodiment of the present invention.

Next, a method for reproducing address information will be described. FIG. 15 shows a procedure of reproducing address information from the conversion information reproduced from the optical disc.

Reproduction conversion information 15 is processed with inverse conversion (bit inversion processing 30) to the conversion of generating conversion information 21 from the coded information 11, to generate reproduction coded information 16. Here, the inverse conversion (bit inversion processing 30) is to invert all the bits of each of symbols $R_2, R_3, R_4, R_9, R_{10}, R_{11}, R_{12}, R_{13}$ of the reproduction conversion information 15. As a result of error correction performed on the reproduction coded information 16, errors within three symbols are corrected. Thus, address information 17 is reproduced.

Figure 16:
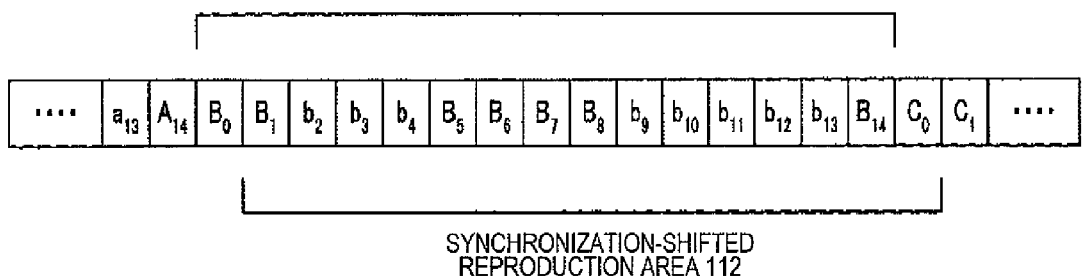
FIG. 16 is a partial enlarged view of the conversion information stream shown in FIG. 14.
Figure 17:
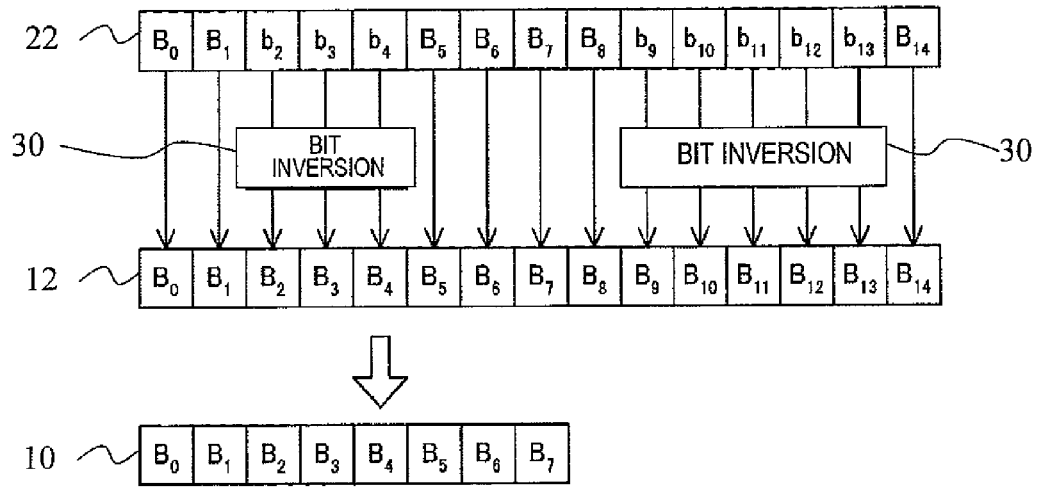
FIG. 17 shows a procedure of reproducing address information from conversion information obtained by reproducing a reproduction area according to an embodiment of the present invention.
Figure 18:
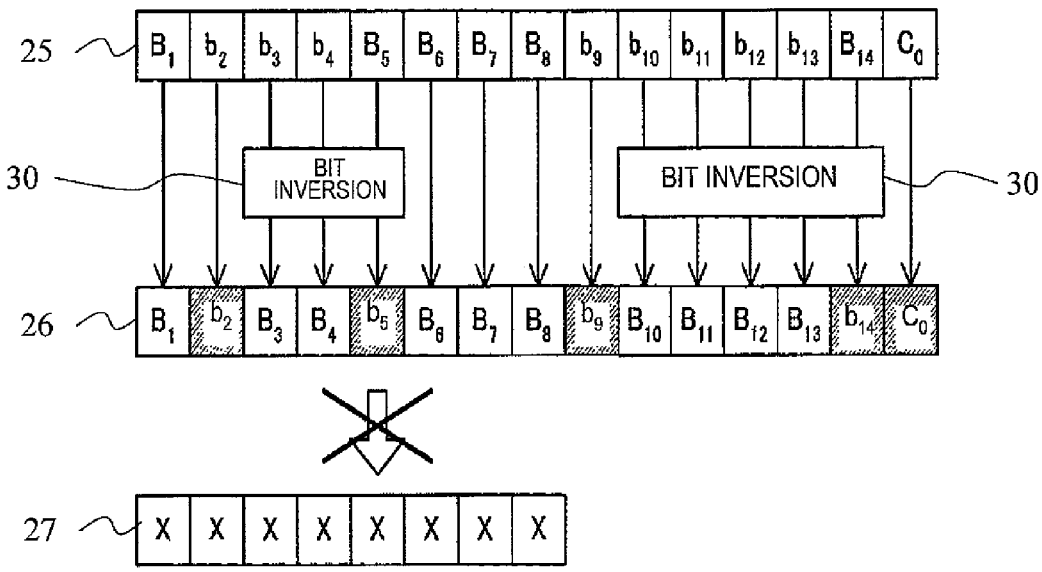
FIG. 18 shows a procedure of reproducing address information from conversion information obtained by reproducing a synchronization-shifted reproduction area 112 according to an embodiment of the present invention.

FIG. 16 shows a partial enlarged view of a stream of the pieces of conversion information shown in FIG. 14. FIG. 16 shows a correct reproduction area 111 and a synchronization-shifted reproduction area 112. FIG. 17 shows a procedure of reproducing address information from the conversion information obtained by reproducing the reproduction information area 111. FIG. 18 shows a procedure of reproducing address information from the conversion information obtained by reproducing the synchronization-shifted reproduction area 112.

Referring to FIG. 17, reproduction conversion information 22 obtained by reproducing the reproduction area 111 is $(B_0, B_1, b_2, b_3, b_4, B_5, B_6, B_7, B_8, b_9, b_{10}, b_{11}, b_{12}, b_{13}, B_{14})$. By performing inverse conversion (bit inversion processing 30) on this, reproduction coded information 12 $(B_0, B_1, B_2, B_3,$ $B_4, B_5, B_6, B_7, B_8, B_9, B_{10}, B_{11}, B_{12}, B_{13}, B_{14}$) is obtained. The reproduction coded information 12 includes no error. Therefore, the error correction processing is normally finished, and address information 10 is correctly reproduced.

Referring to FIG. 18, reproduction conversion information 25 obtained by reproducing the synchronization-shifted reproduction area 112 is ($B_1, b_2, b_3, b_4, B_5, B_6, B_7, B_8, b_9, b_{10}, b_{11}, b_{12}, b_{13}, B_{14}, C_0$). By performing inverse conversion (bit inversion processing 30) on this, reproduction coded information 26 ($B_1, b_2, B_3, B_4, b_5, B_6, B_7, B_8, b_9, B_{10}, B_{11}, B_{12}, B_{13}, b_{14}, C_0$) is obtained.

The reproduction coded information 26 is a code word error-correction-coded by the Reed-Solomon code RS (15,8, 8), and so has a cyclic nature. Namely, ($B_1, B_2, B_3, B_4, B_5, B_6, B_7, B_8, B_9, B_{10}, B_{11}, B_{12}, B_{13}, B_{14}, B_0$) is also a code word of the Reed-Solomon code RS (15,8,8). By comparing this against the reproduction coded information 26, it is found that there are five symbol errors. The number of symbols which can be corrected by the Reed-Solomon code RS (15,8,8) is three or smaller. Therefore, it is detected that the errors of the reproduction coded information 26 cannot be corrected and a determination that an error 27 has occurred can be made on the stage of error correction without incorrect address information being reproduced.

In this manner, when a synchronization shift of one symbol occurs, the coded information is converted into conversion information using a conversion method by which a number of symbols exceeding the correction capability of the error correction code are not recovered to the original symbols, and the obtained conversion information is recorded on an optical disc. Owing to this, even if a synchronization shift of one symbol occurs while the address information is being reproduced, an error can be detected by error correction processing without incorrect address information being reproduced.

In this embodiment, the number of symbols which are not recovered to the original symbols, when a synchronization of one symbol occurs, is determined based on the number of blocks of bits to be inverted. In FIG. 13, two blocks of bits $A_2$ through $A_4$ and $A_9$ through $A_{13}$ are to be inverted. Accordingly, the number of symbols which are not recovered to the original symbols is at least the number of borders between the blocks to be bit-inverted and other blocks, namely, at least twice of the number of the blocks to be bit-inverted, which is four or greater.

Here, regarding a conversion method for generating conversion information from the coded information, it is preferable that a symbol to be bit-inverted and a symbol not to be bit-inverted of the reproduction conversion information 15 are located alternately twice or more.

The symbols $R_0$ through $R_{14}$ of the reproduction conversion information are continuous. Therefore, even where the reproduction conversion information includes two blocks to be bit-inverted, there may be the following case: the symbols $R_{14}$ and $R_0$ are to be bit-inverted, and so the symbols to be bit-inverted are continuous, as a result of which there is only one block to be bit-inverted. By not inverting at least one of the symbols $R_{14}$ and $R_0$, the symbols to be bit-inverted can be divided into two or more blocks with certainty.

As an example, a conversion method by which $B_2$ and $B_{12}$ are bit-inverted and $B_5$ and $B_{14}$ are not bit-inverted will be described, with reference to FIG. 17.

Where $B_2$ is bit-inverted and $B_5$ is not bit-inverted, there is at least one border between $B_2$ and $B_5$ with certainty (in FIG. 17, the border is between $B_4$ and $B_5$). Where $B_5$ is not bit-inverted and $B_{12}$ is bit-inverted, there is at least one border between $B_5$ and $B_{12}$ with certainty (in FIG. 17, the border is between $B_8$ and $B_9$). Where $B_{12}$ is bit-inverted and $B_{14}$ is not bit-inverted, there is at least one border between $B_{12}$ and $B_{14}$ with certainty (in FIG. 17, the border is between $B_{13}$ and $B_{14}$). Where $B_{14}$ is not bit-inverted and $B_2$ is bit-inverted, there is at least one border between $B_{14}$ and $B_2$ with certainty. Accordingly, when information is reproduced, there are at least four borders and so four or more symbol errors occur. When an error correction code which can correct three or smaller number of errors is used, one symbol shift can be detected as an error.

In this embodiment, the conversion is performed by inverting all the bits. Alternatively, only specific bits may be inverted. More generally, exclusive-OR operation of information and a prescribed value may be performed as the conversion. For example, inversion of all the bits can be realized by performing exclusive-OR operation of information and a prescribed value by which all the bits are "1".

(Embodiment 5)

Figure 19:
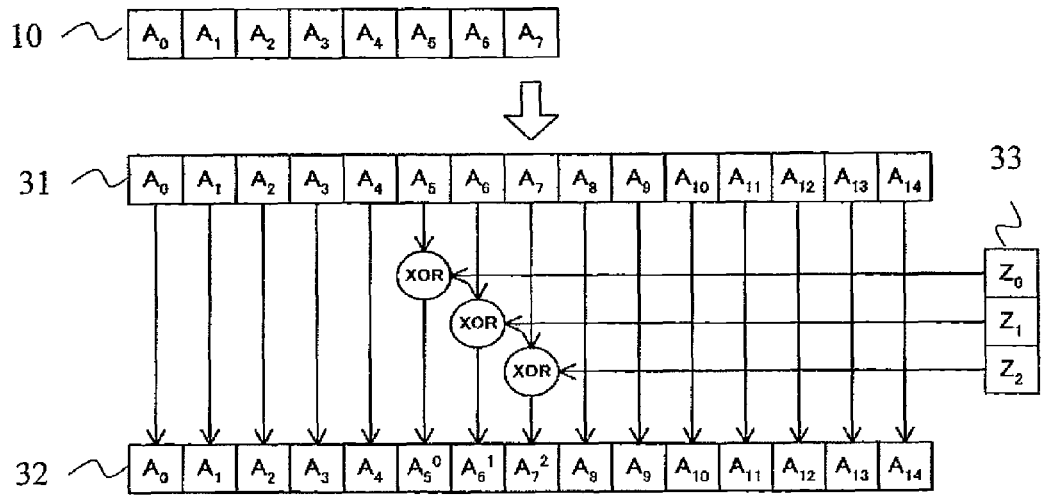
FIG. 19 shows a procedure of generating conversion information according to an embodiment of the present invention.

FIG. 19 shows a procedure of generating conversion information according to Embodiment 5 of the present invention. FIG. 19 shows address information 10, coded information 31, conversion information 32 and a conversion value 33.

The address information 10 of A($A_0, A_1, A_2, A_3, A_4, A_5, A_6, A_7$) shown in FIG. 19 is error-correction-coded by the Reed-Solomon code RS (15,8,8) to generate the coded information 31 including added seven parity symbols.

Each of symbols $A_5, A_6$ and $A_7$ of the coded information 31 is processed with conversion of performing exclusive-OR operation with the conversion value 33 ($Z_0, Z_1, Z_2$) to generate the conversion information 32. Here, $A_x^n$ represents an exclusive-OR of $A_x$ and $Z_n$.

The conversion information 32 generated in this manner is recorded on an optical disc. The conversion information may be recorded using a known system, for example, ADIP used for a DVD+RW disc.

Figure 20:
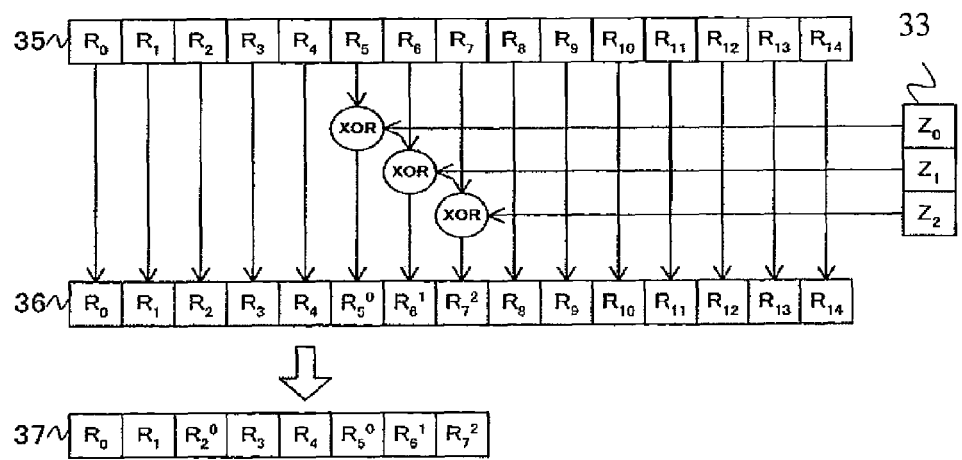
FIG. 20 shows a procedure of reproducing address information from conversion information reproduced from a recording medium according to an embodiment of the present invention.

Next, a method for reproducing address information will be described. FIG. 20 shows a procedure of reproducing address information from the conversion information reproduced from the optical disc. FIG. 20 shows reproduction conversion information 35, reproduction coded information 36 and address information 37.

The reproduction conversion information 35 is processed with inverse conversion to the conversion of generating conversion information 32 from the coded information 31, to generate the reproduction coded information 36. Here, the inverse conversion is to process each of symbols $R_5, R_6$ and $R_7$ of the reproduction conversion information 35 with exclusive-OR operation with the conversion value 33 ($Z_0, Z_1, Z_2$). Here, $Z_0, Z_1$ and $Z_2$ are of different values. As a result of error correction performed on the reproduction coded information 36, errors within three symbols are corrected. Thus, address information 37 is reproduced.

Figure 21:
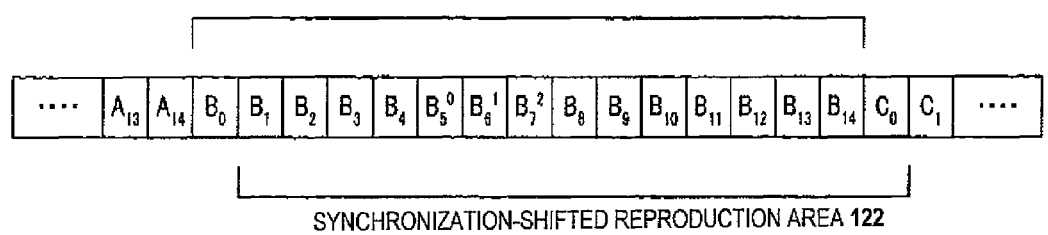
FIG. 21 shows a conversion information stream recorded on a recording medium according to an embodiment of the present invention.
Figure 22:
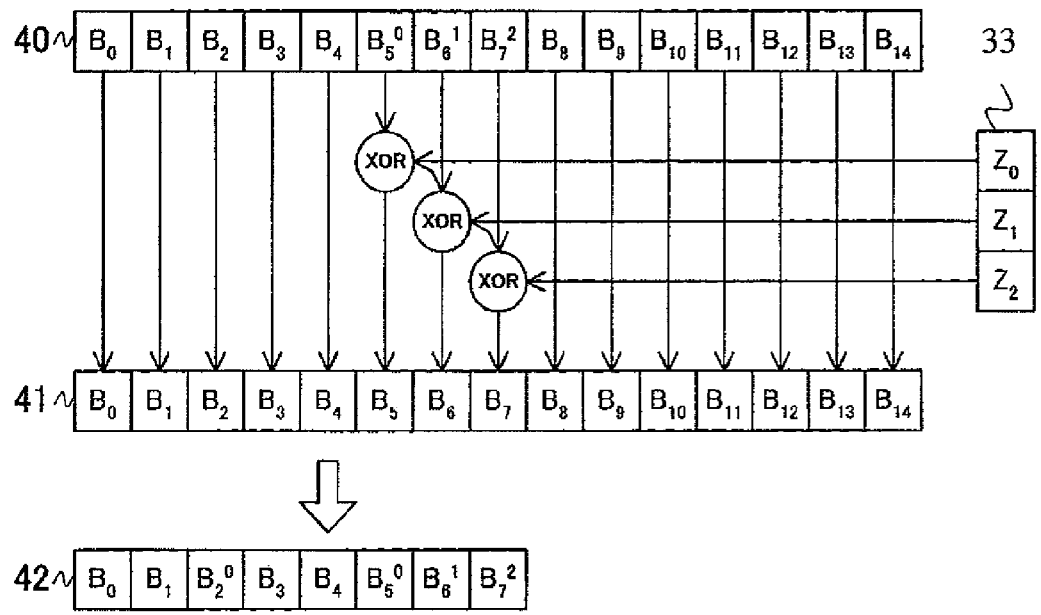
FIG. 22 shows a procedure of reproducing address information from conversion information obtained by reproducing a reproduction area according to an embodiment of the present invention.

FIG. 21 shows a stream of pieces of the conversion information recorded on the optical disc. FIG. 21 shows a correct reproduction area 121 and a synchronization-shifted reproduction area 122. FIG. 22 shows a procedure of reproducing address information from the conversion information obtained by reproducing the reproduction information area 121. FIG. 22 shows reproduction conversion information 40, reproduction coded information 41, address information 42 and the conversion value 33.

The reproduction conversion information 40 obtained by reproducing the reproduction area 121 is ($B_0, B_1, B_2, B_3, B_4, B_5^0, B_6^1, B_7^2, B_8, B_9, B_{10}, B_{11}, B_{12}, B_{13}, B_{14}$). By performing inverse conversion on this, the reproduction coded information 41 ($B_0, B_1, B_2, B_3, B_4, B_5, B_6, B_7, B_8, B_9, B_{10}, B_{11}, B_{12}, B_{13}, B_{14}$) is obtained. The reproduction coded information 41 includes no error. Therefore, the error correction processing is normally finished, and the address information 42 is correctly reproduced.

Figure 23:
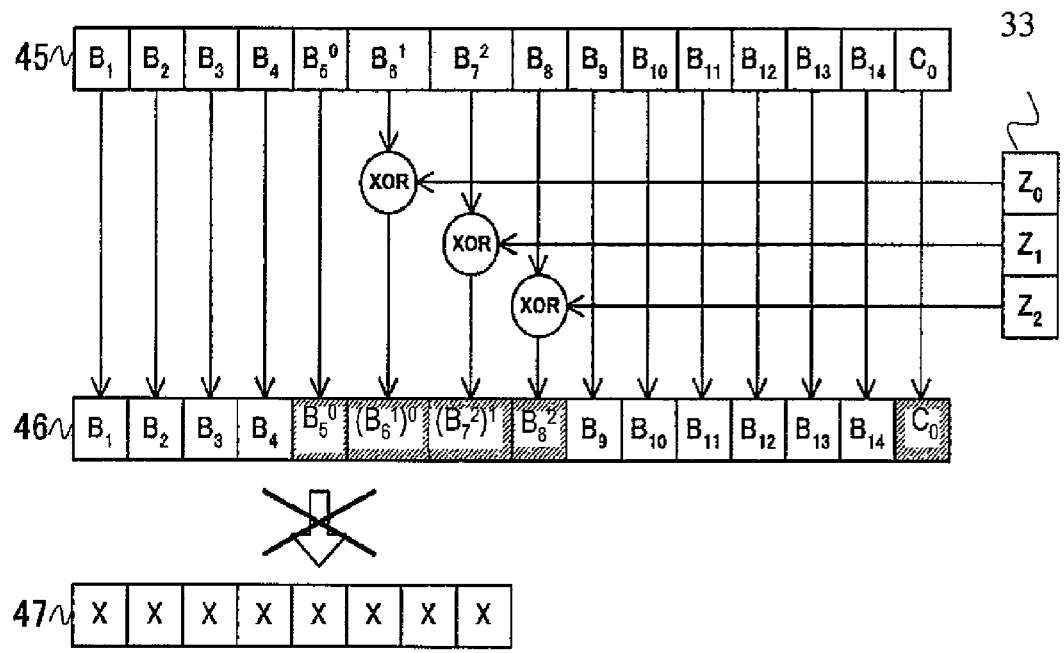
FIG. 23 shows a procedure of reproducing address information from conversion information obtained by reproducing a synchronization-shifted reproduction area according to an embodiment of the present invention.

FIG. 23 shows a procedure of reproducing address information from the conversion information obtained by reproducing the synchronization-shifted reproduction information area 122. FIG. 23 shows reproduction conversion information 45, reproduction coded information 46, the conversion value 33, and an error 47.

The reproduction conversion information 45 obtained by reproducing the synchronization-shifted reproduction area 122 is $(B_1, B_2, B_3, B_4, B_5^0, B_6^1, B_7^2, B_8, B_9, B_{10}, B_{11}, B_{12}, B_{13}, B_{14}, C_0)$. By performing inverse conversion on this, the reproduction coded information 46 $(B_1, B_2, B_3, B_4, B_5^0, (B_6^1)^0, (B_7^2)^1, B_8^2, B_9, B_{10}, B_{11}, B_{12}, B_{13}, B_{14}, C_0)$ is obtained.

The reproduction coded information 41 is a code word error-correction-coded by the Reed-Solomon code RS (15,8, 8), and so has a cyclic nature. Namely, $(B_1, B_2, B_3, B_4, B_5, B_6, B_7, B_8, B_9, B_{10}, B_{11}, B_{12}, B_{13}, B_{14}, B_0)$ is also a code word of the Reed-Solomon code RS (15,8,8). By comparing this against the reproduction coded information 46, it is found that there are five symbol errors. The number of symbols which can be corrected by the Reed-Solomon code RS (15,8,8) is three or smaller. Therefore, it is detected that the errors of the reproduction coded information 46 cannot be corrected and a determination that the error 47 has occurred can be made on the stage of error correction without the incorrect address information 47 being reproduced.

In this manner, when a synchronization shift of one symbol occurs, the coded information is converted into conversion information using a conversion method by which a number of symbols exceeding the correction capability of the error correction code are not recovered to the original symbols, and the obtained conversion information is recorded on an optical disc. Owing to this, even if a synchronization shift of one symbol occurs while the address information is being reproduced, an error can be detected by error correction processing without incorrect address information being reproduced.

In Embodiment 5, $Z_0$, $Z_1$ and $Z_2$ are of different values. All the values do not need to be different. For example, substantially the same effects are provided as long as $Z_0 \neq Z_1$ and $Z_1$, $\neq Z_2$, even if $Z_0 = Z_2$.

(Embodiment 6)

Figure 24:
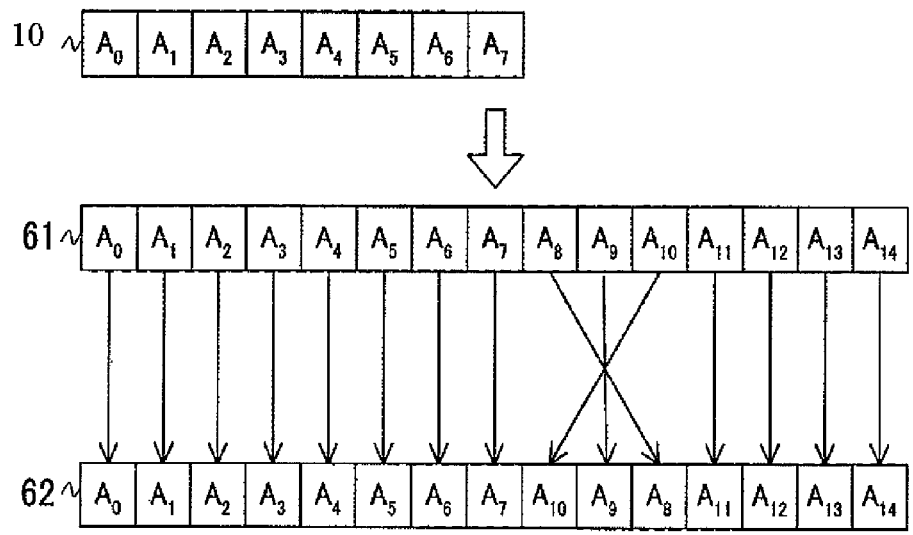
FIG. 24 shows a procedure of generating conversion information according to an embodiment of the present invention.

FIG. 24 shows a procedure of generating conversion information according to Embodiment 6 of the present invention. FIG. 24 shows address information 10, coded information 61 and conversion information 62.

The address information 60 of $A(A_0, A_1, A_2, A_3, A_4, A_5, A_6, A_7)$ shown in FIG. 24 is error-correction-coded by the Reed-Solomon code RS (15,8,8) to generate the coded information 61 including added seven parity symbols. The coded information 61 is processed with conversion of exchanging the positions of the symbols $A_8$ and $A_{10}$ to generate the conversion information 62. The conversion information 62 generated in this manner is recorded on an optical disc. The conversion information may be recorded using a known system, for example, ADIP used for a DVD+RW disc.

Figure 25:
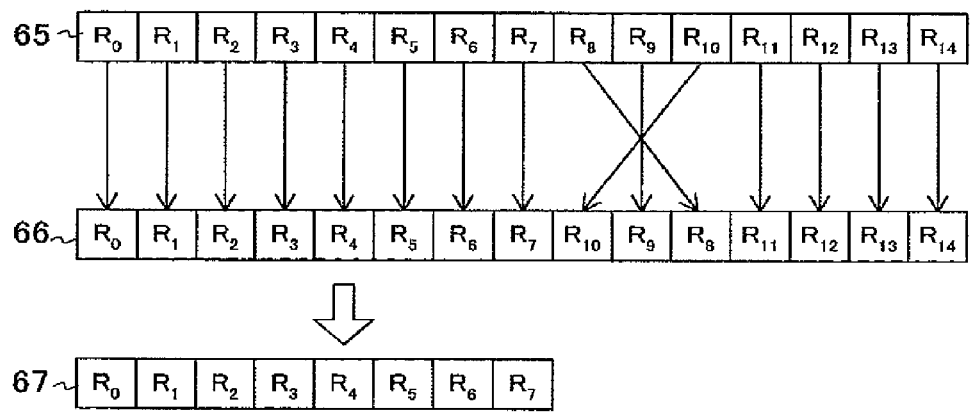
FIG. 25 shows a procedure of reproducing address information from conversion information reproduced from a recording medium according to an embodiment of the present invention.

Next, a method for reproducing address information will be described. FIG. 25 shows a procedure of reproducing address information from the conversion information reproduced from the optical disc. FIG. 25 shows reproduction conversion information 65, reproduction coded information 66 and address information 67.

The reproduction conversion information 65 is processed with inverse conversion to the conversion of generating conversion information 62 from the coded information 61, to generate the reproduction coded information 66. Here, the inverse conversion is to exchange the positions of symbols $R_8$ and $R_{10}$. As a result of error correction performed on the reproduction coded information 66, errors within three symbols are corrected. Thus, address information 67 is reproduced.

Figure 26:
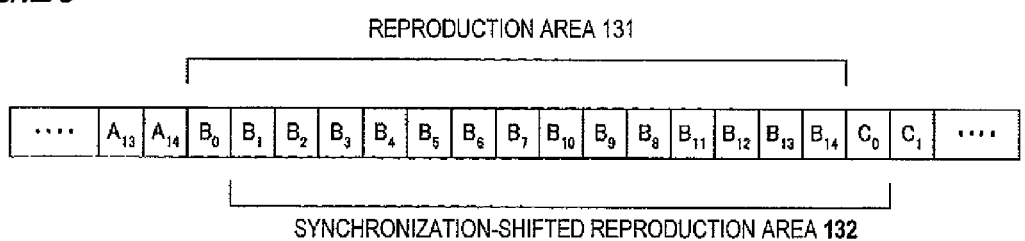
FIG. 26 shows a conversion information stream recorded on a recording medium according to an embodiment of the present invention.
Figure 27:
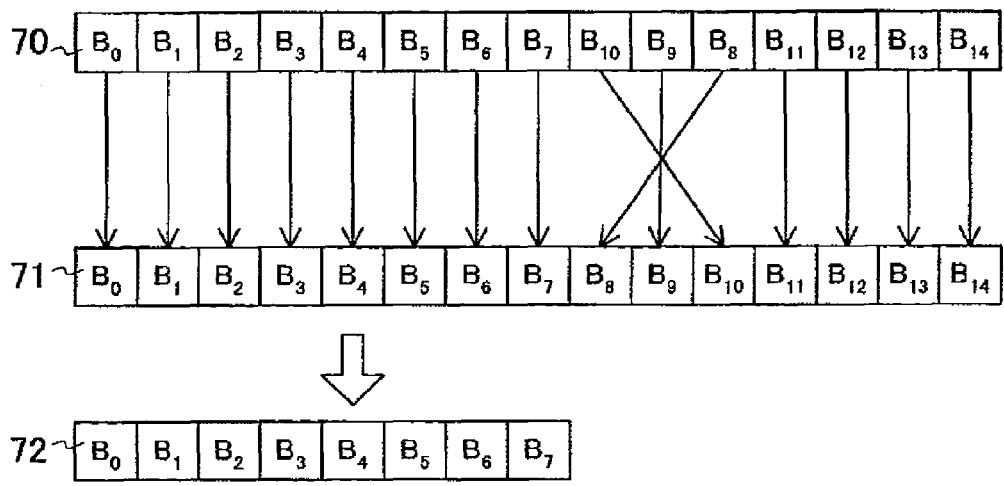
FIG. 27 shows a procedure of reproducing address information from conversion information obtained by reproducing a reproduction area according to an embodiment of the present invention.

FIG. 26 shows a stream of pieces of the conversion information recorded on the optical disc. FIG. 26 shows a correct reproduction area 131 and a synchronization-shifted reproduction area 132. FIG. 27 shows a procedure of reproducing address information from the conversion information obtained by reproducing the reproduction information area 131. FIG. 27 shows reproduction conversion information 70, reproduction coded information 71 and address information 72.

The reproduction conversion information 70 obtained by reproducing the reproduction area 131 is $(B_0, B_1, B_2, B_3, B_4, B_5, B_6, B_7, B_{10}, B_9, B_8, B_{11}, B_{12}, B_{13}, B_{14})$. By performing inverse conversion on this, the reproduction coded information 71 $(B_0, B_1, B_2, B_3, B_4, B_5, B_6, B_7, B_8, B_9, B_{10}, B_{11}, B_{12}, B_{13}, B_{14})$ is obtained. The reproduction coded information 71 includes no error. Therefore, the error correction processing is normally finished, and the address information 72 is correctly reproduced.

Figure 28:
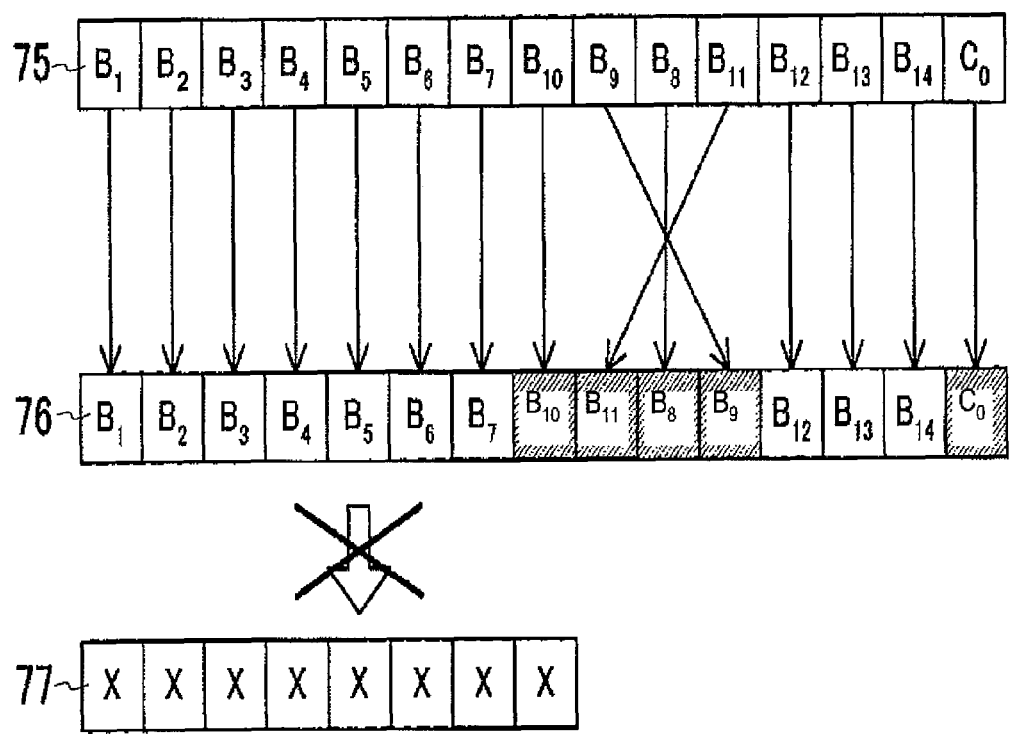
FIG. 28 shows a procedure of reproducing address information from conversion information obtained by reproducing a synchronization-shifted reproduction area according to an embodiment of the present invention.

FIG. 28 shows a procedure of reproducing address information from the conversion information obtained by reproducing the synchronization-shifted reproduction information area 132. FIG. 28 shows reproduction conversion information 75, reproduction coded information 76 and an error 77.

The reproduction conversion information 75 obtained by reproducing the synchronization-shifted reproduction area 132 is $(B_1, B_2, B_3, B_4, B_5, B_6, B_7, B_{10}, B_9, B_8, B_{11}, B_{12}, B_{13}, B_{14}, C_0)$. By performing inverse conversion on this, the reproduction coded information 76 $(B_1, B_2, B_3, B_4, B_5, B_6, B_7, B_{10}, B_{11}, B_8, B_9, B_{12}, B_{13}, B_{14}, C_0)$ is obtained.

The reproduction coded information 71 is a code word error-correction-coded by the Reed-Solomon code RS (15,8, 8), and so has a cyclic nature. Namely, $(B_1, B_2, B_3, B_4, B_5, B_6, B_7, B_8, B_9, B_{10}, B_{11}, B_{12}, B_{13}, B_{14}, B_0)$ is also a code word of the Reed-Solomon code RS (15,8,8). By comparing this against the reproduction coded information 76, it is found that there are five symbol errors. The number of symbols which can be corrected by the Reed-Solomon code RS (15,8,8) is three or smaller. Therefore, it is detected that the errors of the reproduction coded information 76 cannot be corrected and a determination that the error 77 has occurred can be made on the stage of error correction without the incorrect address information 77 being reproduced.

In this manner, when a synchronization shift of one symbol occurs, the coded information is converted into conversion information using a conversion method by which a number of symbols exceeding the correction capability of the error correction code are not recovered to the original symbols, and the obtained conversion information is recorded on an optical disc. Owing to this, even if a synchronization shift of one symbol occurs while the address information is being reproduced, an error can be detected by error correction processing without incorrect address information being reproduced.

The conversion processing in Embodiment 6 is applicable where the symbols $A_8$ and $A_{10}$ are of different values.

In Embodiments 1 through 6 described above, the Reed-Solomon code RS (15,8,8) is used as the error correction code. The present invention is not limited to this. For example, a Reed-Solomon code RS (15,9,7) is usable. Substantially the same effects are provided by using a cyclic code other than the Reed-Solomon code RS (15,8,8) or an error correction code obtained by shortening such a cyclic code.

In Embodiments 4 through 6 described above, symbol $C_0$ included in the reproduction conversion information obtained in a synchronization-shifted state is of a different value from symbol $B_0$. However, address information is generally assigned monotonously increasing or monotonously decreasing values, and therefore two consecutive addresses often have the same value at the most significant bit. Accordingly, even $B_x=C_x$ is acceptable, and it is more preferable to use a conversion method by which a number of symbols exceeding the correction capability of the error correction code is(are) detected as an error(s).

In Embodiments 4 through 6 described above, it is more preferable that the number of errors, caused in the reproduction coded information when a synchronization shift of one symbol is caused, is equal to or smaller than the minimum free distance of the error correction code. The reason is that where the number of errors caused in the reproduction coded information is equal to or larger than the minimum free distance of the error correction code, there may be a case where the reproduction coded information becomes the code word itself of the error correction code and thus the error cannot be detected although this occurs rarely.

In Embodiments 1 through 6 described above, a format in which the address information is located at relatively significant bits in the coded information is described. It is not absolutely necessary that the address information is located at relatively significant bits in the coded information. It is sufficient that the coded information includes the address information, and it is acceptable that some conversion is needed to obtain the address information from the coded information.

The above-described problem regarding the shift of the cycle can be solved by dividing the symbols to be bit-inverted into two or more blocks. Therefore, in Embodiments 1 through 3, it is not necessary that the number of errors which are made when an apparatus not compatible to the bit inversion processing of the first conversion mode performs inverse conversion is at least ½ of the minimum free distance.

Needless to say, where the number of errors is at least ½ of the minimum free distance and the symbols to be bit-inverted are divided into two or more blocks, the problem caused when an apparatus reproduces an optical disc of a format not compatible thereto and the problem regarding the shift of the cycle can both be solved.

(Embodiment 7)

Figure 29:
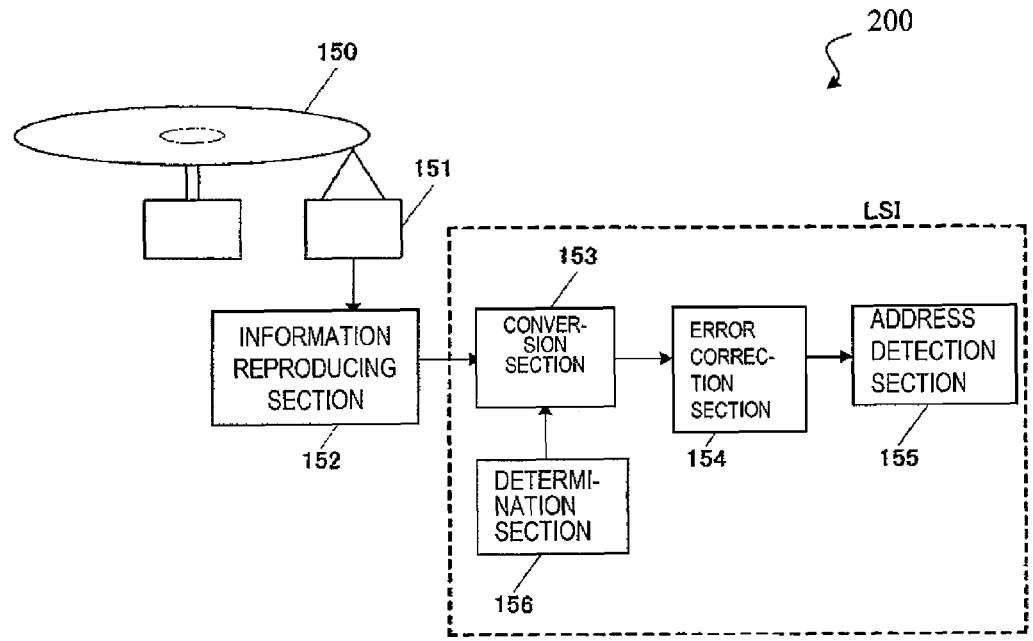
FIG. 29 is a block diagram showing an information reproducing apparatus according to an embodiment of the present invention.

FIG. 29 is a block diagram showing an information reproducing apparatus 200 according to Embodiment 7 of the present invention. The information reproducing apparatus 200 includes an optical pickup 151, an information reproducing section 152, a conversion section 153, an error correction section 154, an address detection section 155, and a determination section 156. The information reproducing apparatus reproduces address information by collecting laser light to the information recording medium, and reproduces user data or the like from the information recording medium based on the reproduced address information.

When an optical disc 150 is mounted on the information reproducing apparatus 200, the determination section 156 determines the type of the optical disc 150 and outputs the determination result to the conversion section 153. The optical pickup 151 irradiates the optical disc 150 with a light beam, generates a reproduction signal from the light reflected by the optical disc 150, and outputs the reproduction signal to the information reproducing section 152. The information reproducing section 152 reproduces conversion information 21 recorded on the optical disc 150 based on the reproduction signal, and outputs reproduction conversion information 22 to the conversion section 153.

The conversion section 153 performs bit inversion 30 for reproduction (inverse conversion to the bit inversion processing 20). The conversion section 153 performs conversion on the reproduction conversion information 22 by a conversion method (bit inversion 30) in accordance with the type of the optical disc 150 determined by the determination section 156, generates reproduction coded information 12 (FIG. 2B), and outputs the reproduction coded information 12 to the error correction section 154. The error correction section 154 corrects errors included in the reproduction coded information 12 to generate correction-coded information, and outputs the correction-coded information to the address detection section 155. The address detection section 155 reproduces address information 10 from the correction-coded information.

Here, it is assumed that address information is recorded on the optical disc 150 by the method shown in FIG. 8A. The information reproducing section 152 reproduces the reproduction conversion information 22 from the reproduction signal and outputs the reproduction conversion information 22 to the conversion section 153. The conversion section 153 performs bit inversion 30 on the reproduction conversion information 22 in accordance with the determination result from the determination section 156. The conversion section 153 performs conversion of inverting all the bits of each of eight symbols ($e_2$ through $e_4$, $e_9$ through $e_{13}$) of the reproduction conversion information 22 to obtain symbols ($E_2$ through $E_4$, $E_9$ through $E_{13}$). Thus, reproduction conversion information 12 including symbols ($E_0$ through $E_{14}$) is obtained. The generated reproduction coded information 12 is output to the error correction section 154. The error correction section 154 corrects errors included in the reproduction coded information 12 to generate correction-coded information, and outputs the correction-coded information to the address detection section 155. The address detection section 155 reproduces the address information 10 from the correction-coded information.

Next, a case where reproduction is performed from an optical disc 150' (not shown), on which address converted by a different conversion method from the method used for the optical disc 150 is recorded, will be described. The optical disc 150 and the optical disc 150' may be different from each other in the recording capacity.

Here, it is assumed that the address information is recorded on the optical disc 150' by the procedure of generating the conversion information shown in FIG. 3A.

The determination section 156 determines the type of the optical disc 150' and outputs the determination result to the conversion section 153. The information reproducing section 152 reproduces reproduction conversion information 22 (FIG. 3B) from the reproduction signal and outputs the reproduction conversion information 22 to the conversion section 153. The conversion section 153 performs bit inversion 30 on the reproduction conversion information in accordance with the determination result from the determination section 156. The conversion section 153 performs conversion of inverting all the bits of each of six symbols ($e_9$ through $e_{14}$) of the reproduction conversion information 22 to obtain symbols ($E_9$ through $E_{14}$). Thus, reproduction coded information 12 including symbols ($E_0$ through $E_{14}$) is obtained.

The generated reproduction coded information 12 is output to the error correction section 154. The error correction section 154 corrects errors included in the reproduction coded information 12 to generate correction-coded information, and outputs the correction-coded information to the address detection section 155. The address detection section 155 reproduces address information from the correction-coded information.

In this manner, the conversion method used by the conversion section 153 is changed in accordance with the type of the optical disc, so that an information reproducing apparatus capable of performing reproduction from a plurality of optical discs, on which address information converted by different conversion methods from one another are recorded, can be realized.

In the case where the conversion methods for the optical discs are merely different in the positions of the symbols to be bit-inverted, the above-mentioned apparatus can be structured with the increase of the circuit scale being suppressed to a very low level.

The determination section 156 may determine the type of the optical disc 150 using the difference in a physical property such as the reflectance of the optical disc 150 or the like, using information recorded in a burst cutting area or the like, or using other known methods.

The determination section 156 may determine the type of the optical disc 150 based on the number of symbols corrected by the error correction section 154. This may be performed by comparing the number of symbols corrected by the error correction section 154 and the number of times the correction is impossible when the determination section 156 outputs the determination result on the optical disc 150 to the conversion section 153, against the number of symbols corrected by the error correction section 154 and the number of times the correction is impossible when the determination section 156 outputs the determination result on the optical disc 150' to the conversion section 153. The optical disc with a smaller value of either the number of symbols or the number of times may be set as the determination result; the number of times the correction is impossible may be prioritized; or the number of times the correction is impossible may be converted into the number of symbol errors exceeding the correction capability of the error correction code, in which case the determination is made based on the total of the results.

Where the type of the optical disc has not been determined, coded information may be first generated by performing one of the inverse conversion to the first conversion mode and the inverse conversion to the second conversion mode on the reproduction conversion information reproduced from the optical disc. Then, error correction is performed on the generated coded information. When the number of errors is at least ½ of the minimum free distance of the error correction code, the other inverse conversion is performed on the conversion information. Thus, address information can be generated.

The conversion section 153, the error correction section 154, the address detection section 155 and the determination section 156 are typically realized as an LSI, which is an integrated circuit.

An apparatus which does not have a function of performing bit inversion described in Embodiment 1 has a structure obtained as a result of excluding the conversion section 153 and the determination section 156 from the apparatus 200 shown in FIG. 29. In this case, bit inversion processing is not performed, and so information is output from the information reproducing section 152 to the error correction section 154.

(Embodiment 8)

Figure 30:
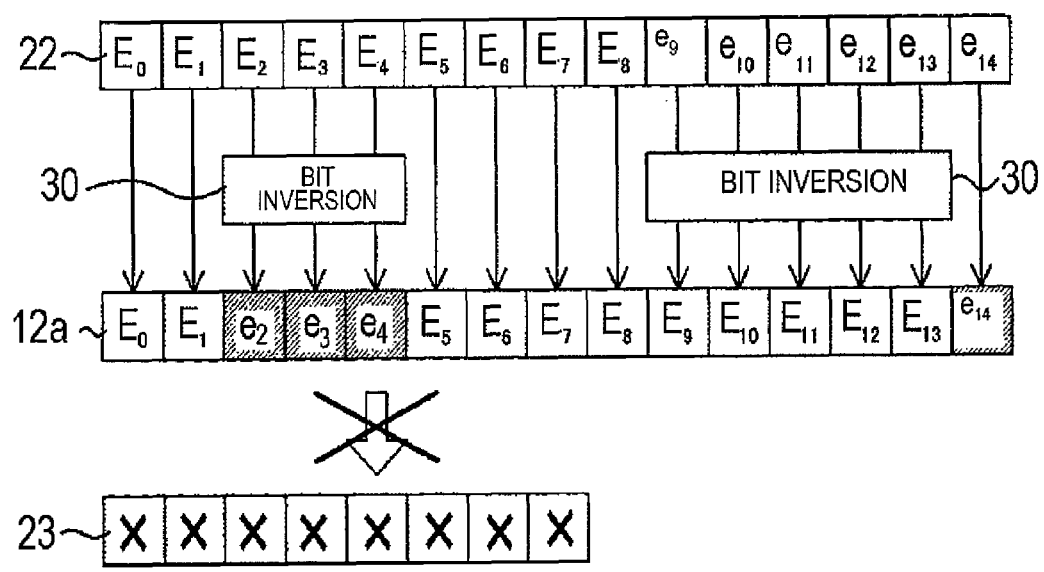
FIG. 30 shows an operation when an optical disc is processed with conversion which should be performed on another optical disc of another format according to an embodiment of the present invention.

Now, an operation made when incorrect conversion is performed on the optical disc 150 or the optical disc 150' will be described. FIG. 30 shows an operation made when conversion which should be performed on the optical disc 150 is performed on the optical disc 150'.

It is assumed that reproduction conversion information 22 reproduced from the optical disc 150' includes no error. The conversion which should be performed on the optical disc 150 (bit inversion 30) is performed on the reproduction conversion information 22 by the conversion section 153 to generate reproduction coded information 12a. As compared with the code word ($E_0$ through $E_{14}$), the reproduction coded information 12a includes four symbol errors ($e_2$, $e_3$, $e_4$, $e_{14}$). The number of errors which can be corrected by the error correction code is three or smaller. Therefore, the error correction section 154 detects that the reproduction coded information 12a is not correctable, and an error 23 is detected without the address information 10 being reproduced.

An operation made when conversion which should be performed on the optical disc 150' is performed on the optical disc 150 is substantially the same as the operation described above with reference to FIG. 8B.

It is assumed that reproduction conversion information 22 reproduced from the optical disc 150 includes no error. The conversion which should be performed on the optical disc 150' is performed on the reproduction conversion information 22 by the conversion section 153 to generate reproduction coded information 12a. As compared with the code word ($E_0$ through $E_{14}$), the reproduction coded information 12a includes four symbol errors ($e_2$, $e_3$, $e_4$, $e_{14}$). The number of errors which can be corrected by the error correction code is three or smaller. Therefore, the error correction section 154 detects that the reproduction coded information 12a is not correctable, and an error 23 is detected without the address information 10 being reproduced.

A reproduction operation of an apparatus, described in Embodiment 3, which is compatible to the bit inversion processing of the second conversion mode but not compatible to the bit inversion processing of the first conversion mode is substantially the same as above.

Now, general conditions, under which incorrect address information is prevented from being reproduced even when correct conversion is not selected for the optical disc 150 or 150', will be described in detail with reference to FIG. 31 and FIG. 32.

Figure 31:
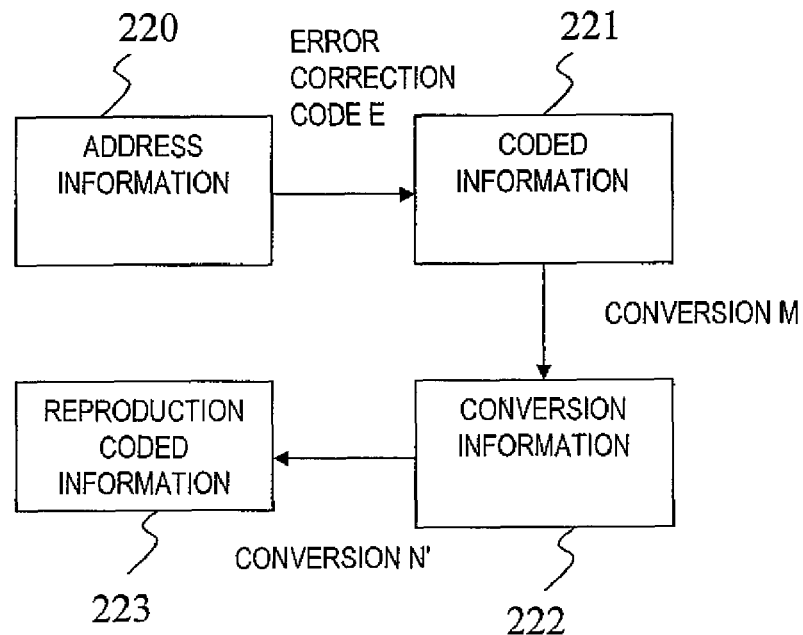
FIG. 31 shows conditions for preventing incorrect reproduction according to an embodiment of the present invention.
Figure 32:
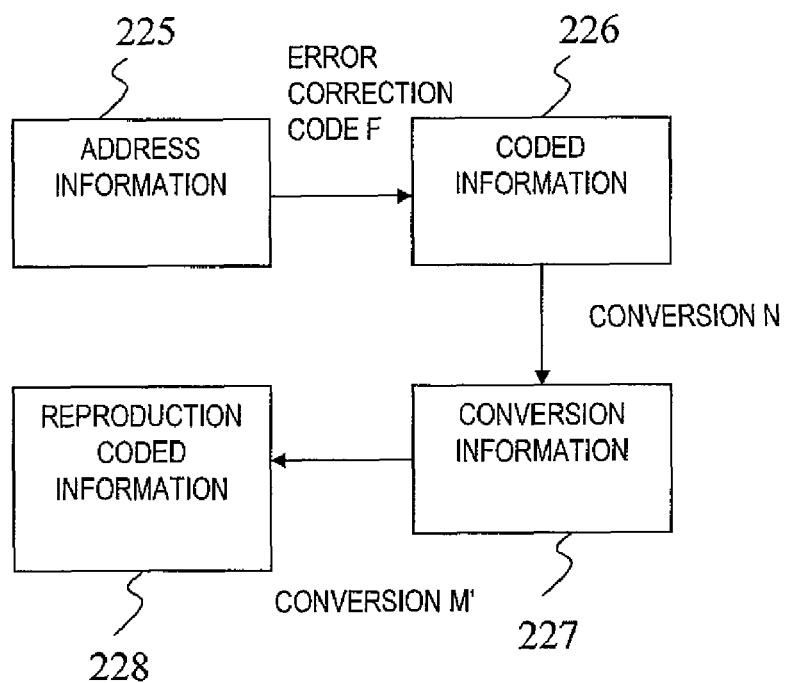
FIG. 32 shows conditions for preventing incorrect reproduction according to an embodiment of the present invention.

FIG. 31 shows conditions for preventing reproduction from a first optical disc. FIG. 31 shows address information 220, coded information 221, conversion information 222, and reproduction coded information 223. FIG. 32 shows conditions for preventing reproduction from a second optical disc. FIG. 32 shows address information 225, coded information 226, conversion information 227, and reproduction coded information 228.

The address information 220 is error-correction-coded by an error correction code E to generate the coded information 221. The conversion information 222 obtained by performing conversion M on the coded information 221 is recorded on the first optical disc.

The address information 225 is error-correction-coded by an error correction code F to generate the coded information 226. The conversion information 227 obtained by performing conversion N on the coded information 226 is recorded on the second optical disc.

In order to prevent the first optical disc from being reproduced as a result of being mistaken as the second information, the distance between the reproduction coded information 223 obtained by performing inverse conversion N' to the conversion N on the conversion information 222 and the coded information 221 should exceed the correction capability of the error correction code E.

In order to prevent the second optical disc from being reproduced as a result of being mistaken as the first information, the distance between the reproduction coded information 228 obtained by performing inverse conversion M' to the conversion M on the conversion information 227 and the coded information 226 should exceed the correction capability of the error correction code F.

In Embodiments 7 and 8, the Reed-Solomon code RS (15,8,8) is used as the error correction code. The present invention is not limited to this. Substantially the same effects are provided by using other error correction codes. For example, a Reed-Solomon code RS (15,9,7) is usable.

In Embodiments 7 and 8, it is not absolutely necessary to use the same error correction code for the two optical discs. For example, Reed-Solomon codes having different code lengths may be used as long as such Reed-Solomon codes are defined by the same generator polynomial expression. In this case also, the same error correction section 154 is usable, and increase of the circuit scale can be suppressed.

In Embodiments 7 and 8, all the bits of prescribed symbols are inverted as a conversion method. Any other conversion method which allows inverse conversion is usable to provide substantially the same effects.

In Embodiments 1 through 8, address information may be recorded by a different method from user data by wobbling of the track or the like, or may be recorded on the track by the same method as user data.

Figure 33:
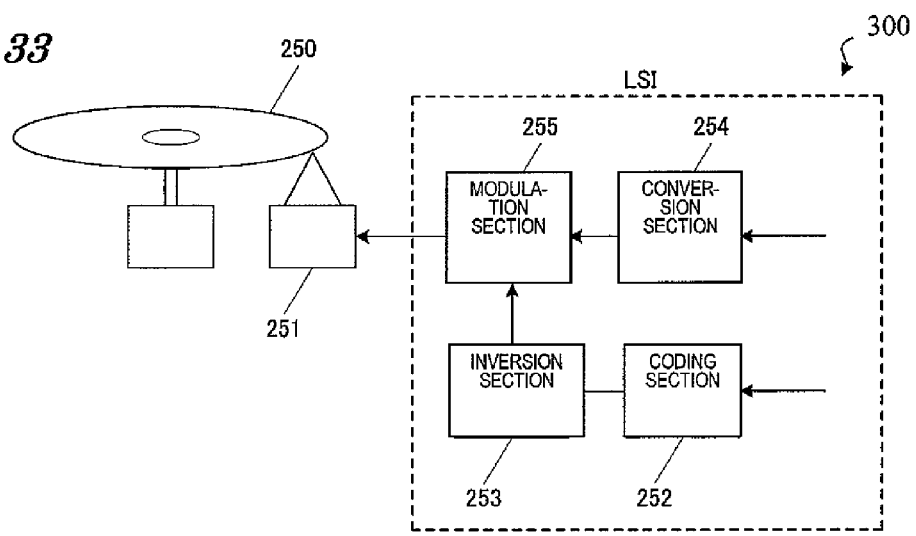
FIG. 33 is a block diagram showing an information recording apparatus for recording address information according to an embodiment of the present invention.

FIG. 33 is a block diagram showing an information recording apparatus 300 for recording address information. The information recording apparatus 300 records conversion information 21 obtained by bit inversion as an AUN (Address Unit Number) address. The AUN address is inserted into user data and recorded on the optical disc together with the user data.

The information recording apparatus 300 includes a recording section 251, a coding section 252, an inversion section 253, a conversion section 254, and a modulation section 255.

To the coding section 252, address information is input. The coding section 252 performs error correction coding on the address information to generate coded information, and outputs the coded information to the inversion section 253. The inversion section 253 inverts prescribed symbols of the coded information to generate conversion information, and outputs the conversion information to the modulation section 255.

To the conversion section 254, user data is input. The conversion section 254 performs scrambling or error correction coding on the user data to generate recording data, and outputs the recording data to the modulation section 255.

The modulation section 255 modulates the conversion information and the recording data, and adds a synchronization mark or the like thereto, to generate a recording bit stream. Then, the modulation section 255 outputs the recording bit stream to the recording section 251. The recording section 251 outputs laser light to the optical disc 250 in accordance with the recording bit stream and thus forms marks and spaces on the track of the optical disc 250.

The scrambling performed by the conversion section 254 may use the entirety or a part of the address information as a seed.

The error correction coding performed by the conversion section 254 may also be performed on the conversion information together with the user data.

Other information may be added to the conversion information. Other types of error correction coding may be performed additionally.

Where the disc 250 is a reproduction-only disc, pits are formed on the disc 250.

Now, a method for recording conversion information 21 obtained by bit inversion on an optical disc as a wobble address (ADIP) will be described.

Figure 34:
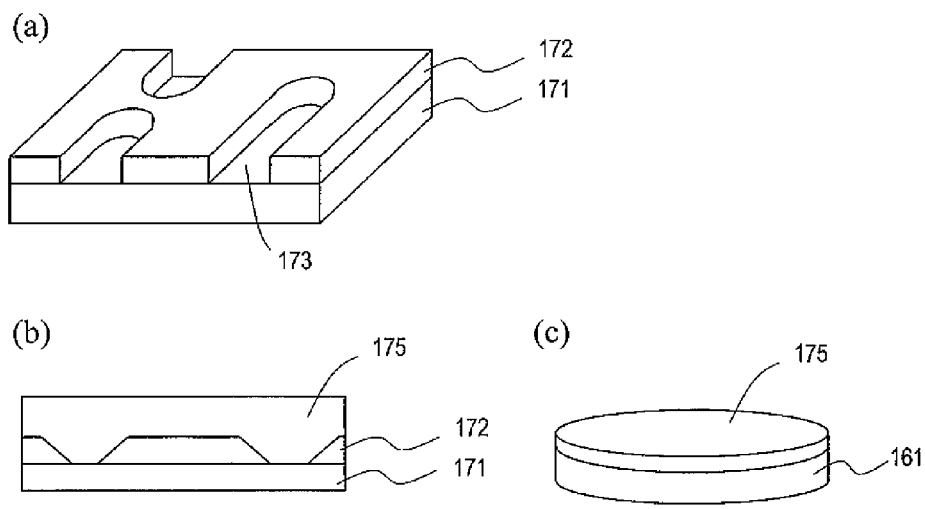
FIGS. 34(a) through (c) show a production method of an optical disc according to an embodiment of the present invention.

FIG. 34 shows a production method of an optical disc 150. The production method of the optical disc 150 (information recording medium) includes a mastering process of forming a stamper (press form) used for molding a substrate and a replication process of molding the substrate using the stamper.

FIG. 34(a) shows a glass master disc 171 having a resist 172 formed thereon. A liquid photoresist is formed as a layer on the glass master disc 171 by spin-coating, and exposed and developed. Thus, the resist 172 having concave portions 173 is obtained.

In the case of a stamper for producing a ROM information recording medium, the concave portions 173 correspond to pits. In the case of a stamper for producing a write once or rewritable information recording medium, the concave portions 173 correspond to grooves. In the case of a stamper for producing an information recording medium having both pits and grooves, the concave portions 173 correspond to both of the pits and the grooves. In an information recording medium, at least one of pits and grooves are formed. Instead of concave portions 173, convex portions 173 may be formed. Owing to such an arrangement of convex portions and concave portions, concentric or spiral tracks are formed on the information recording medium.

Referring to FIG. 34(b), the glass master disc 171 having the resist 172 formed thereon is plated with Ni or other metal to form a metal plating layer 175. The metal plating layer 175 is peeled off from the glass master disc 171 and is used as a stamper. The stamper has pits and/or grooves 173 transferred thereon.

Figure 35:
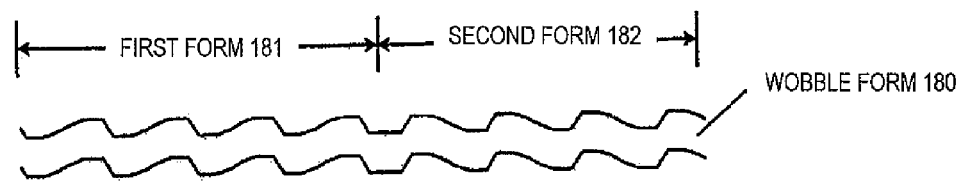
FIG. 35 shows a wobble form of a groove according to an embodiment of the present invention.

FIG. 35 shows a wobble form 180 of a groove 173. The wobble form 180 includes a first form 181 and a second form 182, which are both sawtooth-like. The first form 181 has gentle rises and steep falls, whereas the second form 182 has steep rises and gentle falls. For example, one of the first form 181 and the second form 182 represents "1" and the other represents "0". By forming the groove 173 having the first form 181 and the second form 182 in combination, address information (conversion information 21) is recorded on the optical disc 150.

Next, referring to FIG. 34(c), the pits and/or grooves 173 of the stamper 175 are transferred to a melted plastic material by injection molding or the like, and thus a substrate 161 having the pits and/or grooves 173 formed thereon is obtained.

On the substrate 161 obtained in this manner, a recording layer, an intermediate layer, a cover layer and the like are formed. Thus, the optical disc 150 is obtained.

In Embodiments 1 through 8, address information is described as a target of bit inversion. The present invention is applicable to information other than address information, or a combination of a plurality of types of information. For example, the present invention is applicable to a combination of address information and additional information other than address information.

In Embodiments 1 through 8, the number of errors which can be corrected by an error correction code may be 0, and the error correction code may be used as an error detection code.

(Embodiment 9)

Hereinafter, as an example of a case to which the present invention is applicable, optical discs of different formats, for example, of different recording densities will be described. For example, there are an optical disc of a first recording density of a format corresponding to an apparatus, and an optical disc of a second recording density of a format not corresponding to the apparatus. According to the present invention, different formats are not necessarily different recording densities.

An example of the optical disc having a first recording density is a Blu-ray disc (BD) having a recording capacity per layer of 25 GB (or 27 GB). The Blu-ray disc is available as a reproduction-only BD-ROM disc, a write once BD-R disc, a rewritable BD-RE disc or the like. The main optical constants and physical formats of the Blu-ray disc are disclosed in "Blu-ray Disc Reader" published by Ohmsha, Ltd. or the white papers put on the web site of the Blu-ray Association (http://www.blu-raydisc.com/).

Now, main parameters of a BD will be described. For the BD, laser light having a wavelength of 405 nm (where the tolerable error range is ±5 nm, 400 to 410 nm) and an objective lens having an NA of 0.85 (where the tolerable error range is ±0.01 nm, 0.84 to 0.86) are used.

The track pitch of the BD is 0.32 µm, and one or two recording layers are provided. One or two recording layers are provided on one side on which the laser light is incident. In the BD, the distance from the surface of a protection layer to the recording surface is 75 µm to 100 µm.

As the modulation system for a recording signal, 17PP modulation is used. The shortest mark length to be recorded (2T mark) is 0.149 µm (channel bit length T: 74.50 nm).

The recording capacity is 25 GB (or 27 GB) (more precisely, 25.025 GB (or 27.020 GB) where one layer is provided on one side, or 50 GB (or 54 GB) (more precisely, 50.050 GB (or 54.040 GB) where two layers are provided on one side.

The channel clock frequency is 66 MHz (channel bit rate: 66.000 Mbits/s) at the BD standard rate (BD1×), 264 MHz (channel bit rate: 264.000 Mbits/s) at the 4× rate (BD4×), 396 MHz (channel bit rate: 396.000 Mbits/s) at the 6× rate (BD6×) rate, and 528 MHz (channel bit rate: 528.000 Mbits/s) at the 8× rate (BD8×).

The standard linear velocity (reference linear velocity, 1×) is 4.917 m/sec. The linear velocity at 2×, 4×, 6× and 8× is respectively 9.834 m/sec., 19.668 m/sec., 29.502 m/sec., and 39.336 m/sec. A linear velocity higher than the reference liner velocity is generally a positive integral multiple of the reference liner velocity, but is not limited to an integral multiple and may be a positive real number multiple of the reference liner velocity. A linear velocity lower than the reference liner velocity, such as 0.5 times (0.5×), may also be defined.

Now, as an optical disc having a second recording density, an optical disc having a higher recording density than that of the first recording density (for example, an optical disc of the BD format which has a larger recording capacity per layer than 25 GB (or 27 GB)) will be considered.

As seen from the recent increase of size of data to be recorded, which is caused by, for example, high definition broadcast, recording mediums are always desired to have a larger capacity and a higher density. One method for increasing the recording density of a BD which has a recording capacity per layer of 25 GB is, for example, to decrease the track pitch. However, this significantly changes the structure of the current optical discs, and so requires the optical structure of optical disc apparatuses to be significantly changed. From the viewpoint of compatibility with the current format, this method raises the cost of the optical head, is not highly feasible, and increases the influence of crosstalk from an adjacent track.

Hence, as an example of an optical disc having a second recording density, an optical disc having an improved recording density as compared to the 25 GB BD with no change in the wavelength, numerical aperture, track pitch or the like (having a shorter channel bit length) will be considered.

Figure 36:
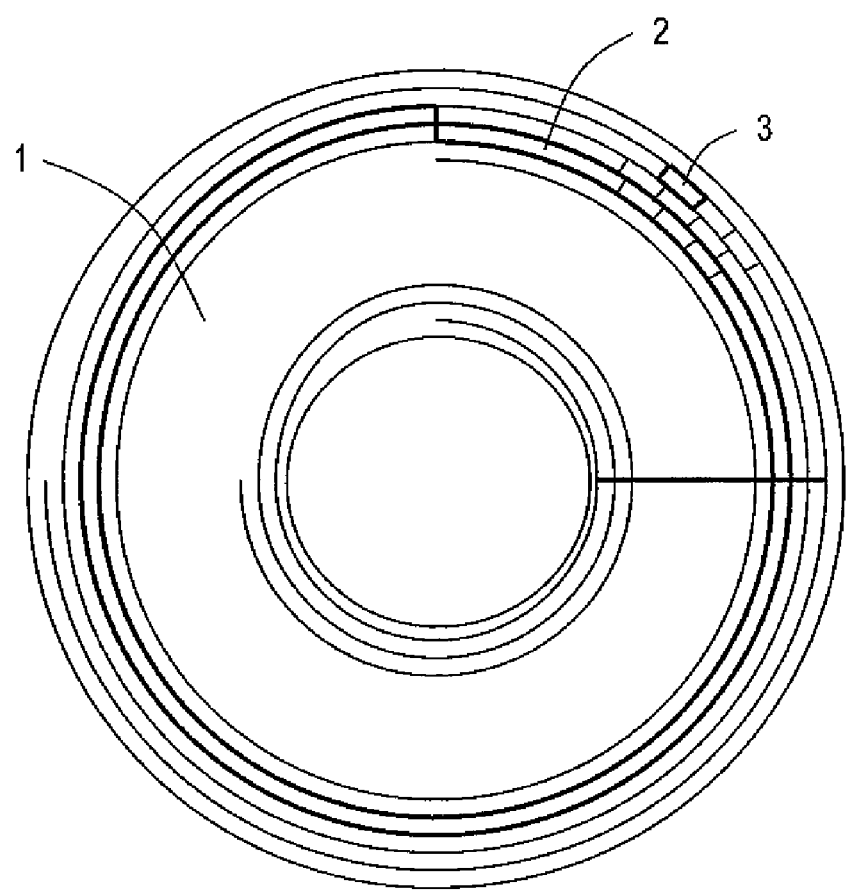
FIG. 36 shows a physical structure of an optical disc according to an embodiment of the present invention.

FIG. 36 shows a physical structure of an optical disc 1 having the second recording density. On the discus-shaped optical disc 1, a great number of tracks 2 are formed concentrically or in a spiral, for example. In each track 2, a great number of tiny sectors are formed. As described later, data is recorded on each track 2 in units of blocks 3 each having a predetermined size, as described later.

The optical disc 1 having the second recording density has an expanded recording capacity per information recording layer as compared with an optical disc having the first recording density (for example, a 25 GB BD). The recording capacity is expanded by raising the recording linear density, for example, by decreasing the length of a recording mark recorded on the optical disc. Here, the expression "raising the recording linear density" means to decrease the channel bit length. The "channel bit length" refers to a length corresponding to cycle T of the reference clock for recording a mark. The optical disc 1 may include a plurality of layers. In the following, only one information recording layer will be described for the convenience of explanation. Even where the width of the track is the same among a plurality of layers provided in the optical disc, the recording linear density may be varied on a layer-by-layer basis by changing the mark length on a layer-by-layer basis according to a certain manner.

The track 2 is divided into blocks by a data recording unit of 64 kB (kilobytes), and the blocks are sequentially assigned block address values. Each block is divided into sub blocks each having a prescribed length. Three sub blocks form one block. The sub blocks are assigned sub block numbers of 0 through 2 from the first sub block.

Figure 37A:
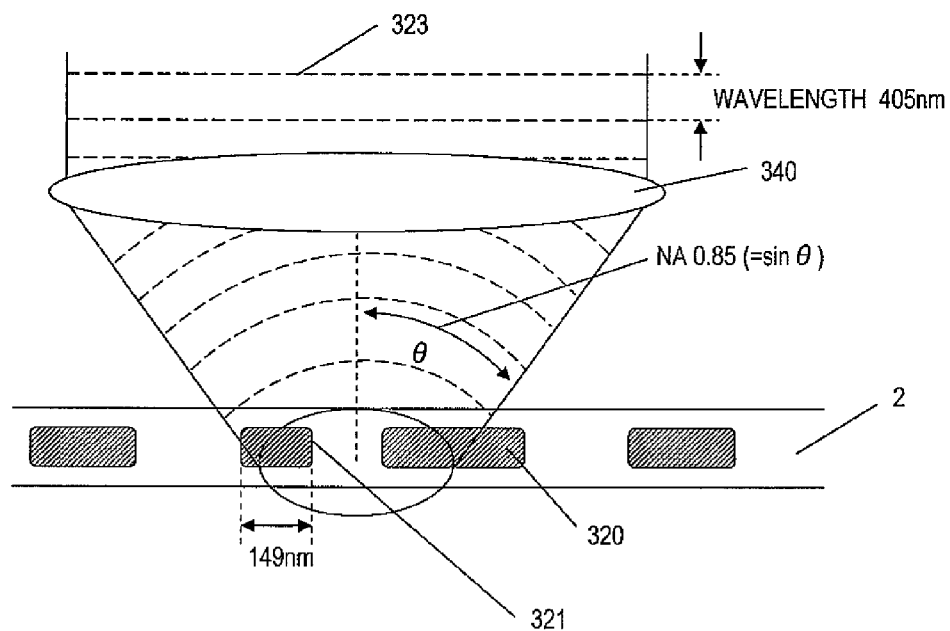
FIG. 37A shows a 25 GB BD according to an embodiment of the present invention.

Now, the recording density will be described with reference to FIG. 37A, FIG. 37B, FIG. 38 and FIG. 39. FIG. 37A shows a 25 GB BD, which is an example of an optical disc having the first recording density. For the BD, the wavelength of laser light 323 is 405 nm and the numerical aperture (NA) of an objective lens 340 is 0.85. Like in a DVD, in the BD also, the recording data is recorded as marks 320 and 321 formed by a physical change on the track 2 of the optical disc. A mark having the shortest length among these marks is referred to as the "shortest mark". In the figure, the mark 321 is the shortest mark (2T).

In the case of the 25 GB BD, the physical length of the shortest mark 321 is 0.149 µm. This corresponds to about 1/2.7 of that of a DVD. Even if the resolving power of the laser light is raised by changing the wavelength parameter (405 nm) and the NA parameter (0.85) of the optical system, the physical length of the shortest mark is close to the limit of the optical resolving power, i.e., the limit at which a light beam can identify a recording mark.

Figure 38:
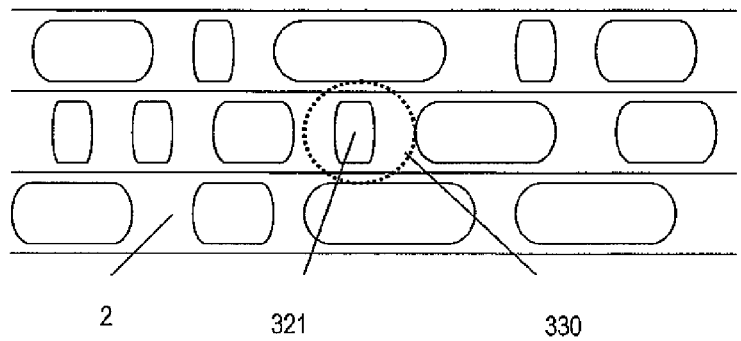
FIG. 38 shows how a mark stream recorded on the track is irradiated with a light beam according to an embodiment of the present invention.

FIG. 38 shows how a mark stream recorded on the track is irradiated with a light beam. In the BD, an optical spot 330 has a diameter of about 0.39 µm because of the above-mentioned parameters of the optical system. When the recording linear density is raised without changing the structure of the optical system, the recording mark becomes small with respect to the diameter of the optical spot 330, and therefore the resolving power for reproduction is declined.

Figure 37B:
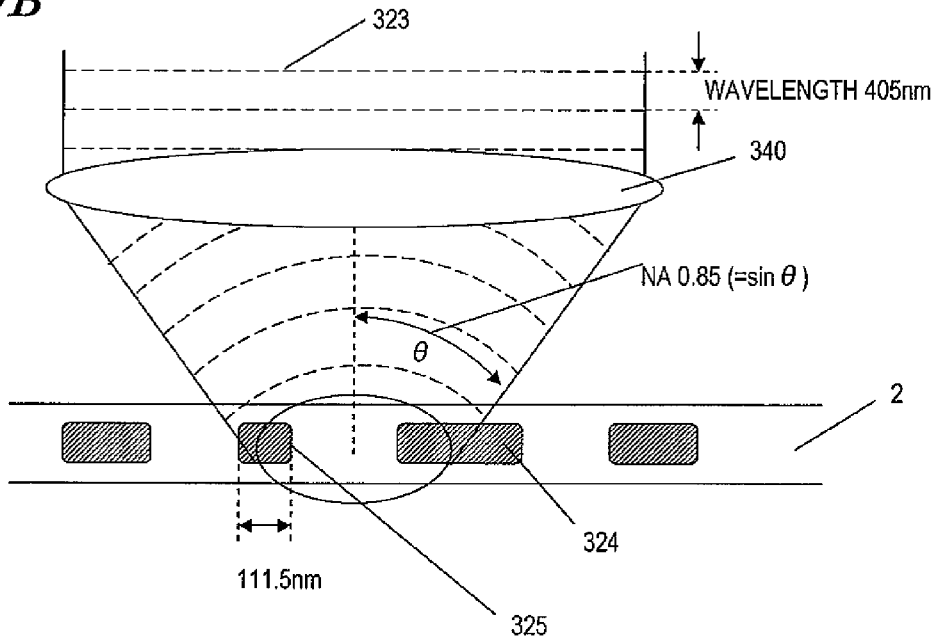
FIG. 37B shows an optical disc having a higher recording density than that of the 25 GB BD according to an embodiment of the present invention.

For example, FIG. 37B shows an example of an optical disc having the second recording density, which is higher than the recording density of the 25 GB BD. For this disc also, the wavelength of the laser light 323 is 405 nm and the numerical aperture (NA) of the objective lens 340 is 0.85. A mark shortest among the marks 325 and 324, namely, the mark 325, has a physical length of 0.1115 µm. As compared with the BD shown in FIG. 37A, in the disc in FIG. 37B, the diameter of the spot is the same at about 0.39 µm but the recording mark is smaller and the inter-mark gap is narrower. Therefore, the resolving power for reproduction is declined.

An amplitude of a reproduction signal obtained by reproducing a recording mark using a light beam decreases as the recording mark is shortened, and becomes almost zero at the limit of the optical resolving power. The inverse of the cycle of the recording mark is called "spatial frequency", and the relationship between the spatial frequency and the signal amplitude is called OTF (Optical Transfer Function). The signal amplitude decreases almost linearly as the spatial frequency increases. The critical frequency for reproduction at which the signal amplitude becomes zero is called "OTF cutoffs".

Figure 39:
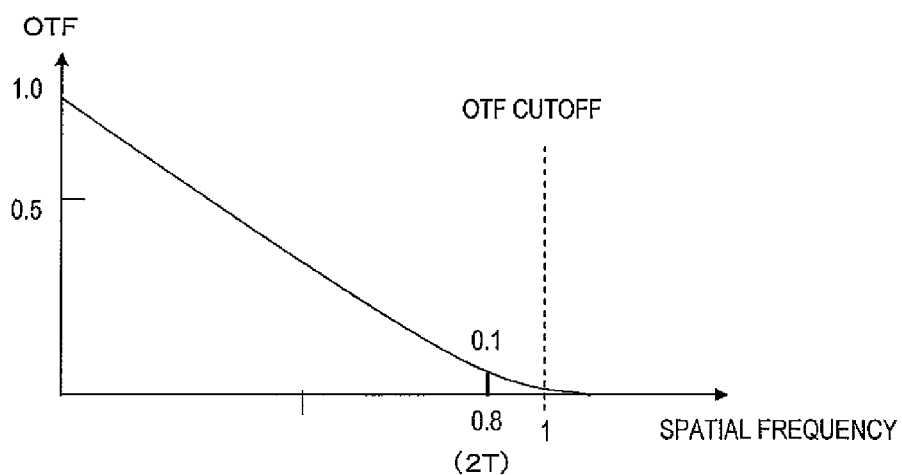
FIG. 39 shows the relationship between the OTF and the shortest recording mark regarding a BD having a recording capacity of 25 GB according to an embodiment of the present invention.

FIG. 39 shows the relationship between the OTF and the shortest recording mark regarding the 25 GB BD. The spatial frequency of the shortest recording mark of the BD is about 80% with respect to the OTF cutoff, which is close to the OTF cutoff. It is also seen that the amplitude of the reproduction signal of the shortest mark is very small at about 10% of the maximum detectable amplitude. For the BD, the recording capacity at which the spatial frequency of the shortest recording mark is the OTF cutoff, i.e., the recording capacity at which the reproduction amplitude of the shortest mark is almost zero, is about 31 GB. When the frequency of the reproduction signal of the shortest mark is around, or exceeds, the OFF cutoff frequency, the resolving power of the laser light is close to the limit or may exceed the limit. In such an area, the amplitude of the reproduction signal decreases and the S/N ratio is drastically deteriorated.

With the recording density which is assumed for the high density optical disc having the second recording density shown in FIG. 37B, the frequency of the shortest mark of the reproduction signal is in the vicinity of the OTE cutoff (including a case where the frequency is equal to or lower than the OTF cutoff, but is not significantly lower than the OTF cutoff) or equal to or higher than the OTF cutoff.

As the recording capacity, the following can be considered. In the case where the frequency is in the vicinity of the OTF cutoff, the recording capacity may be, for example, about 29 GB (e.g., 29 GB±0.5 GB or 29 GB±1 GB, etc.), equal to or larger than 29 GB, about 30 GB (e.g., 30 GB±0.5 GB or 30 GB±1 GB, etc.), equal to or larger than 30 GB, about 31 GB (e.g., 31 GB±0.5 GB or 31 GB±1 GB, etc.), equal to or larger than 31 GB, about 32 GB (e.g., 32 GB±0.5 GB or 32 GB±1 GB, etc.), or equal to or larger than 32 GB. In the case where the frequency is equal to or higher than the OTF cutoff, the recording capacity may be, for example, about 32 GB (e.g., 32 GB±0.5 GB or 32 GB±1 GB, etc.), equal to or larger than 32 GB, about 33 GB (e.g. 33 GB±0.5 GB or 33 GB±1 GB, etc.), equal to or larger than 33 GB, about 33.3 GB (e.g., 33.3 GB±0.5 GB or 33.3 GB±1 GB, etc.), equal to or larger than 33.3 GB, about 34 GB (e.g., 34 GB±0.5 GB or 34 GB±1 GB, etc.), equal to or larger than 34 GB, about 35 GB (e.g., 35 GB±0.5 GB or 35 GB±1 GB, etc.), or equal to or larger than 35 GB.

Figure 40:
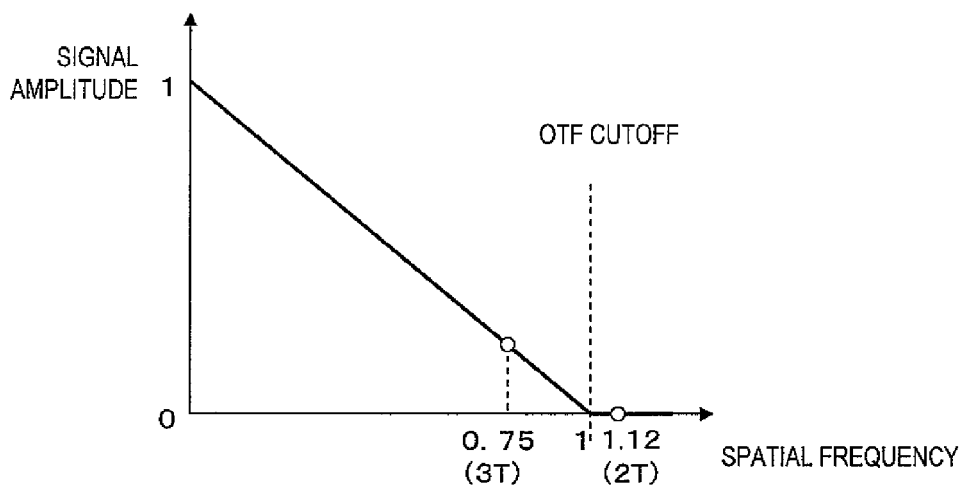
FIG. 40 shows an example in which the spatial frequency of the shortest mark (2T) is higher than the OTF cutoff frequency and the amplitude of a 2T reproduction signal is 0 according to an embodiment of the present invention.

FIG. 40 shows an example in which the spatial frequency of the shortest mark (2T) is higher than the OTF cutoff frequency and the amplitude of a 2T reproduction signal is 0. The spatial frequency of the shortest mark, 2T, is 1.12 times of the OTF cutoff frequency.

The relationship among the wavelength, the numerical aperture, and the length of a mark/space in the high recording the second recording density is as follows.

Where the three parameters, i.e., the laser light wavelength $\lambda$ (405 nm±5 nm, i.e., 400 through 410 nm), the NA (0.85±0.01, i.e., 0.84 through 0.86), and the length P of the shortest mark+the shortest space (in the case of 17 modulation, P=2T+2T=4T) are used, when the reference T decreases to fulfill P<$\lambda$/2NA, the OTF cutoff frequency is exceeded.

The reference T corresponding to the OTF cutoff frequency when NA=0.85 and $\lambda$=405 nm is:

$$T=405/(2\times 0.85)/4=59.558 \text{ nm}.$$

As described above, an optical disc having the second recording density as considered above may be provided as an optical disc of a format not corresponding to the apparatus. For such an optical disc, there is a problem of the S/N ratio deterioration caused by the reproduction amplitude of the shortest mark or the like. In addition, in the case where the recording capacity per layer of the optical disc having the second recording density is, for example, 33 GB, addresses for the part after 25 GB (addresses corresponding to 25 GB to 33 GB) which are not handled by the format corresponding to the apparatus are provided to the disc. Due to these problems, the apparatus used for an optical disc of a format not compatible thereto may malfunction. The present invention can prevent such a malfunction.

As described above, a recording method according to the present invention comprises the steps of performing first conversion of bit-inverting at least one symbol of a code word coded using an error correction code and including a plurality of symbols to generate conversion information; and recording the conversion information on a first recording medium. The first conversion is set such that a distance between first information obtained by performing inverse conversion to the first conversion on the conversion information, and second information obtained by performing inverse conversion to second conversion, which is different from the first conversion, on the conversion information, is at least ½ of a minimum free distance of the error correction code.

According to an embodiment, the first conversion bit-inverts m number (m is an integer) of consecutive symbols.

According to an embodiment, the first conversion allows at least one non-bit-inverted symbol to be present among a prescribed m number (m is an integer) of bit-inverted symbols.

According to an embodiment, the second conversion bit-inverts symbols C(9) through C(14) of a code word including symbol C(i) [i=0, 1, 2, . . . 14].

According to an embodiment, the first conversion generates conversion information to be recorded on the first recording medium; and the second conversion generates conversion information to be recorded on a second recording medium having a different recording capacity from that of the first recording medium.

According to an embodiment, the first conversion does not bit-invert the symbol C(14).

According to an embodiment, the information coded using the error correction code includes at least address information; and the first conversion bit-inverts a symbol including the least significant bit of the address information.

A recording method according to the present invention comprises the steps of performing first conversion of bit-inverting m number (1≦m<n; m is an integer) of symbols at prescribed positions of a code word coded using an error correction code and including symbol (i) [i=0, 1, 2, . . . n; n is an integer] to generate conversion information; and recording the conversion information on a first recording medium. The first conversion is set such that a distance between first information obtained by performing inverse conversion to the first conversion on the conversion information, and second information obtained by performing inverse conversion to second conversion, which bit-inverts j number (1≦j<n; j is an integer) of consecutive symbols from the end of symbol C(i)

unlike the first conversion, on the conversion information, is at least ½ of a minimum free distance of the error correction code.

An information recording medium according to the present invention has conversion information recorded thereon, obtained by bit-inverting m number (1≦m<n; m is an integer) of symbols of a code word including symbol C(i) [i=0, 1, 2, . . . n; n is an integer).

According to an embodiment, a plurality of the symbols are bit-inverted; and the plurality of bit-inverted symbols allow at least one non-bit-inverted symbol to be present among a prescribed m number of bit-inverted symbols, and are divided into k number (k is an integer of 2 or greater) of symbol groups which are not adjacent to each other.

According to an embodiment, among the k number of symbol groups, between a first symbol group and a second symbol group, there are p number (p is an integer of 2 or greater) of symbols.

According to an embodiment, one of the k number of symbol groups includes symbol C(2).

According to an embodiment, one of the k number of symbol groups includes symbol C(3).

According to an embodiment, one of the k number of symbol groups includes symbol C(12).

According to an embodiment, the number of the symbol groups is 3 or greater; and one of the symbol groups includes symbols C(2) and C(3).

An information recording medium according to the present invention includes information in which symbol C(2) and symbol C(12) are bit-inverted, and symbol C(5) and symbol C(14) are not bit-inverted.

A reproducing method according to the present invention is for reproducing information from the first information recording medium having address information recorded by the above-described recording method, by which the recorded address information is reproduced by collecting laser light on the first information medium, and reproduction is performed from the information recording medium based on the address information.

According to an embodiment, where the number of errors of coded information obtained by performing one of inverse conversion to the first conversion and inverse conversion to the second conversion on the conversion information reproduced from the first recording medium is at least ½ of a minimum free distance of the error correction code, the other of the inverse conversion to the first conversion and the inverse conversion to the second conversion is performed on the conversion information.

An information recording method according to an embodiment of the present invention comprises the steps of performing error correction coding on recording information with a cyclic code or an error correction code obtained by shortening the cyclic code to generate coded information; performing prescribed conversion on the coded information to generate conversion information; and recording the conversion information on a recording medium. The prescribed conversion is such that a distance between first shift information obtained by shifting the conversion information by one symbol in a cyclic manner and performing inverse conversion to the prescribed conversion, and second shift information obtained by shifting the information by one symbol in a cyclic manner in the same direction as the first shift information, is at least ½ of a minimum free distance of the error correction code.

According to an embodiment, conversion is performed by which the distance between the first shift information and the second shift information is smaller than the minimum free distance of the error correction code.

According to an embodiment, the prescribed conversion performs exclusive-OR operation of a prescribed symbol of the information and a prescribed value.

According to an embodiment, the prescribed conversion performs exclusive-OR operation of prescribed symbols of the information and a prescribed value determined for each of the symbols.

According to an embodiment, the prescribed conversion exchanges arrangement orders of prescribed symbols of the information.

According to an embodiment, the recording information includes at least address information.

An embodiment of the present invention provides an information recording apparatus comprising coding means for performing error correction coding on recording information with a cyclic code or an error correction code obtained by shortening the cyclic code to generate coded information; conversion means for performing prescribed conversion on the coded information to generate conversion information; and recording means for recording the conversion information on a recording medium. The prescribed conversion is such that a distance between first shift information obtained by shifting the conversion information by one symbol in a cyclic manner and performing inverse conversion to the prescribed conversion, and second shift information obtained by shifting the information by one symbol in a cyclic manner in the same direction as the first shift information, is at least ½ of a minimum free distance of the error correction code.

An embodiment of the present invention provides an information recording medium, on which conversion information is recorded, the conversion information being obtained by performing error correction coding on recording information with a cyclic code or an error correction code obtained by shortening the cyclic code to generate coded information and then performing prescribed conversion on the coded information. The prescribed conversion is such that a distance between first shift information obtained by shifting the conversion information by one symbol in a cyclic manner and performing inverse conversion to the prescribed conversion, and second shift information obtained by shifting the information by one symbol in a cyclic manner in the same direction as the first shift information, is at least ½ of a minimum free distance of the error correction code.

An embodiment of the present invention provides an information reproducing apparatus comprising reproducing means for reproducing, from a recording medium, information recorded on the recording medium after being error-correction-coded and converted; conversion means for performing inverse conversion on the information to generate conversion information; error correction means for performing error correction on the conversion information; extraction means for extracting recording information from the conversion information which is corrected by the error correction means; and determination means for determining the type of the recording medium. The conversion means performs the inverse conversion in accordance with the type of the recording medium determined by the determination means.

According to an embodiment, the determination means outputs different determination results sequentially to the conversion means, and selects a determination result based on the number of errors corrected by the error correction means.

According to an embodiment, the determination means outputs different determination results sequentially to the conversion means, and selects a determination result based on the number of times the error correction means cannot make an error correction.

According to an embodiment, the determination means outputs different determination results sequentially to the conversion means, and selects a determination result based on the number of errors corrected by the error correction means and the number of times the error correction means cannot make an error correction.

An embodiment of the present invention provides an integrated circuit comprising conversion means for performing, on information recorded on a recording medium after being error-correction-coded and converted, inverse conversion to generate conversion information; error correction means for performing error correction on the conversion information; extraction means for extracting recording information from the conversion information which is corrected by the error correction means; and determination means for determining the type of the recording medium. The conversion means performs the inverse conversion in accordance with the type of the recording medium determined by the determination means.

The present invention is especially useful in the technological field of an optical disc for recording error-correction-coded information.

What is claimed is:

1. An information recording medium, wherein conversion information, obtained by inverting all bits of each of m numbers ($2 \leq m < n$; m is an integer) of symbols of an error correction code word including symbol $C(i)$ [$i=0, 1, 2, \ldots n$; n is an integer], is recorded by a wobble form of a track,
   the error correction code word is obtained by coding on address information of the information recording medium with an error correction code which is a cyclic code,
   at least one non-bit-inverted symbol is presented among m numbers of bit-inverted symbols,
   a plurality of bit-inverted symbols are divided into k number (k is an integer of 2 or greater) of symbol groups which are not adjacent to each other,
   at least one of the symbol $C(0)$ and the symbol $C(n)$ is a non-bit-inverted symbol, and
   a number which is 2 times k is larger than the number of symbols which can be corrected by the error correction code.

2. A reproducing apparatus for reproducing information from the information recording medium of claim 1, the reproducing apparatus comprising an information reproducing section,
   wherein the information reproducing section reads the conversion information from the wobble form of the track by using the laser light,
   the information reproducing section performs bit inversion processing on symbols of the conversion information located at the same positions as the m numbers of bit-inverted symbols to generate address information, and
   the information reproducing section reproduces information from the information recording medium based on the address information.

3. A recording apparatus for recording information on the information recording medium of claim 1, the recording apparatus comprising an information recording section,
   wherein the information recording section reads the conversion information from the wobble form of the track by using the laser light,
   the information recording section performs bit inversion processing on symbols of the conversion information located at the same positions as the m numbers of bit-inverted symbols to generate address information, and
   the information recording section records information on the information recording medium based on the address information.

* * * * *